United States Patent
Yang et al.

(10) Patent No.: US 10,978,156 B2
(45) Date of Patent: Apr. 13, 2021

(54) CONCURRENT PROGRAMMING OF MULTIPLE CELLS FOR NON-VOLATILE MEMORY DEVICES

(71) Applicant: SanDisk Technologies LLC, Plano, TX (US)

(72) Inventors: Xiang Yang, San Jose, CA (US); Aaron Lee, San Jose, CA (US); Gerrit Jan Hemink, San Jose, CA (US); Ken Oowada, San Jose, CA (US); Toru Miwa, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 85 days.

(21) Appl. No.: 16/024,002

(22) Filed: Jun. 29, 2018

(65) Prior Publication Data

US 2020/0005871 A1 Jan. 2, 2020

(51) Int. Cl.
| | | |
|---|---|---|
| *G11C 8/12* | (2006.01) | |
| *G11C 16/10* | (2006.01) | |
| *G11C 11/56* | (2006.01) | |
| *G11C 16/04* | (2006.01) | |
| *G11C 16/34* | (2006.01) | |
| *G11C 8/18* | (2006.01) | |

(52) U.S. Cl.
CPC .............. *G11C 16/10* (2013.01); *G11C 8/12* (2013.01); *G11C 8/18* (2013.01); *G11C 11/5628* (2013.01); *G11C 16/0483* (2013.01); *G11C 16/3459* (2013.01); *G11C 2211/5624* (2013.01); *G11C 2216/16* (2013.01)

(58) Field of Classification Search
CPC .. G11C 8/12; G11C 8/18; G11C 16/10; G11C 11/5628; G11C 16/0483; G11C 16/3459; G11C 2216/16; G11C 2211/5624; G11C 2211/5641; G11C 2211/562; G11C 2211/5621; G11C 2211/5622; G11C 11/5671

See application file for complete search history.

(56) References Cited

U.S. PATENT DOCUMENTS

| | | |
|---|---|---|
| 6,345,001 B1 | 2/2002 | Mokhlesi |
| 6,907,497 B2 | 6/2005 | Hosono et al. |
| 6,914,823 B2 | 7/2005 | Chen et al. |
| 6,917,542 B2 | 7/2005 | Chen et al. |
| 6,944,063 B2 | 9/2005 | Chen et al. |
| 7,149,110 B2 | 12/2006 | Van Tran et al. |
| 7,339,834 B2 | 3/2008 | Lutze |
| 7,408,810 B2 | 8/2008 | Aritome et al. |

(Continued)

*Primary Examiner* — Jay W. Radke
(74) *Attorney, Agent, or Firm* — Vierra Magen Marcus LLP

(57) ABSTRACT

Apparatuses, systems, and methods are disclosed for concurrently programming non-volatile storage cells, such as those of an SLC NAND array. The non-volatile storage cells may be arranged into a first block comprising a first string of storage cells that intersects with a first word line at a first storage cell, a second block comprising a second string of storage cells that intersects with a second word line at a second storage cell, a bit line electrically connectable to the first string and the second string, and controller configured to apply a programming pulse, at an elevated voltage, to the first word line and second word line to concurrently program the first and second storage cells.

21 Claims, 16 Drawing Sheets

(56) References Cited

U.S. PATENT DOCUMENTS

| | | | |
|---|---|---|---|
| 7,495,966 B2 | 2/2009 | Aritome | |
| 7,808,819 B2 | 10/2010 | Murin et al. | |
| 7,808,836 B2 | 10/2010 | Murin et al. | |
| 8,971,128 B2 | 3/2015 | Chin et al. | |
| 9,548,124 B1 | 1/2017 | Hazeghi et al. | |
| 9,639,462 B2 | 5/2017 | Camp et al. | |
| 10,153,046 B1* | 12/2018 | Agarwal | G11C 16/107 |
| 10,529,435 B2 | 1/2020 | Puthenthermadam et al. | |
| 2005/0024939 A1 | 2/2005 | Chen et al. | |
| 2005/0141312 A1* | 6/2005 | Sinclair | G06F 11/1072 |
| | | | 365/222 |
| 2007/0253256 A1 | 11/2007 | Aritome | |
| 2008/0130368 A1 | 6/2008 | Lutze | |
| 2009/0122608 A1 | 5/2009 | Aritome | |
| 2010/0074014 A1* | 3/2010 | Dunga | G11C 16/26 |
| | | | 365/185.17 |
| 2014/0301142 A1 | 10/2014 | Stoev et al. | |
| 2015/0301755 A1* | 10/2015 | Chodem | G06F 3/065 |
| | | | 714/764 |
| 2016/0071599 A1* | 3/2016 | Hsu | G11C 16/10 |
| | | | 365/185.12 |
| 2016/0092302 A1* | 3/2016 | Agarwal | G06F 3/0679 |
| | | | 714/773 |
| 2016/0092325 A1* | 3/2016 | Bar | G06F 11/0775 |
| | | | 714/6.1 |
| 2016/0188404 A1* | 6/2016 | Das | G06F 11/1048 |
| | | | 714/773 |
| 2019/0163620 A1* | 5/2019 | Muthiah | G06F 3/0688 |

\* cited by examiner

CONCURRENT PROGRAMMING OF MULTIPLE CELLS FOR NON-VOLATILE MEMORY DEVICES

TECHNICAL FIELD

The present disclosure, in various embodiments, relates to storage devices, and more particularly, to systems and methods for concurrently programming multiple cells of a non-volatile storage device.

BACKGROUND

Many data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (e.g., voltage thresholds, resistivity thresholds, or the like) within its range determines the cell's state, thus allowing recovery of a stored data value.

Nonvolatile memory types include, but are not limited to, ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), spin-transfer torque (STT) MRAM, spin orbit torque SOT-MRAM, magnetic storage media (e.g., hard disk, tape), optical storage media, and the like. Among non-volatile memory types used to encode information in retained charges, various charging and/or charge retention technologies may be used, including but not limited to floating gate and charge trapping technologies.

In many of the foregoing technologies, storage cells in distinct blocks are programmed in separate operations. In some instances, multiple copies of data are temporarily written to corresponding sets of the storage cells prior to storage of the data in a multiple level cell (MLC). Examples of MLC cells include three level cells (TLC), four level cells (QLC), five level cells, and the like. If the temporarily stored data are written to cells of a different capacity, such as single level cells (SLC), a cell compaction operation (folding operation) or the like may be used to combine multiple bits using the temporarily stored data in the SLC cells to provide the value to be encoded to the MLC cell. Conventional methods by which the temporary copies are separately written and verified add to the time and number of steps needed to encode the MLC cell.

SUMMARY

Apparatuses and methods are presented for concurrently programming multiple storage cells of one or more non-volatile memory elements.

Apparatuses and methods are presented for concurrently programming multiple storage cells of one or more non-volatile memory elements. In one example, a memory die includes a set of non-volatile storage cells arranged into a first block including a first string of storage cells that intersects with a first word line at a first storage cell and a second block including a second string of storage cells that intersects with a second word line at a second storage cell, a bit line electrically connectable to the first string and the second string, and a controller configured to concurrently apply a programming pulse to the first word line and second word line to concurrently program the first and second storage cells to a common target threshold voltage.

In another example, the controller is further configured to, after concurrently applying the programming pulse to the first word line and second word line, concurrently apply a verify pulse to the first word line and second word line, sense current flowing through one of the first storage cell and the second storage cell in response to application of the verify pulse to determine that one of the first storage cell and the second storage cell is not correctly programmed, and in response to determining that one of the first storage cell and the second storage cell is not correctly programmed, initiate separate programming of the first storage cell and the second storage cell.

In one example embodiment, separately programming of the first storage cell and the second storage cell includes applying a conventional programming operation, to the first storage cell, and after verifying that the first storage cell is correctly programmed, applying a conventional programming operation to the second storage cell.

In one example, the controller is further configured to, after application of the conventional programming pulses to the second cell, apply a second verify pulse to the first storage cell, sense current flowing through one of the first storage cell and the second storage cell in response to application of the second verify pulse to determine that the first storage cell is correctly programmed, after applying the second verify pulse to the first storage cell, apply a third verify pulse to the second storage cell, and sense current flowing through one of the first storage cell and the second storage cell in response to application of the third verify pulse to determine that the second storage cell is correctly programmed.

In another example, the controller is further configured to determine that the first storage cell is correctly programmed, in response to determining that the first storage cell is correctly programmed, read data from the first storage cell, and after reading the data from the first storage cell, overwrite the first storage cell and the second storage cell.

In one example embodiment, the controller is further configured to read data from one of the first storage cell and the second storage cell, and use the data to program a multi-level cell in a cell compaction operation. In general, a cell compaction (a.k.a. memory cell compaction) operation is an operation that takes data values stored in original memory cells holding one, or more, data values and moves the data values to cells capable of holding more data values than the number of data values held in the original memory cells. For example, in one embodiment, the cell compaction operation is SLC-TLC cell compaction which means that data values in memory cells holding a single data value are moved by storing them in a combined encoding into a single memory cell that holds three data values. In other examples, the cell compaction is SLC-MLC, MLC-QLC, TLC-QLC, SLC-QLC, or the like as one skilled in the art may appreciate.

In another example embodiment, the second block is in a separate physical portion of the set of non-volatile storage cells from the first block.

In one example, an apparatus includes a set of non-volatile storage cells arranged into a first block and a second block, each of which is electrically connected to a set of bit lines, the first block comprising a first word line and the second block comprising a second word line, a selection circuit configured to electrically select a first set of storage cells in the first block and a second set of storage cells in the second block, and a programming circuit configured to apply, at an elevated voltage, a programming pulse to the first word line and second word line to concurrently write the same data, in a single pulse, to the first set of storage cells and the second set of storage cells.

In another example, the apparatus further includes a verification circuit configured to concurrently apply a verify pulse to the first word line and second word line, sense current flowing through respective storage cells connected to the set of bit lines in response to application of the verify pulse to determine that one of the first set of storage cells and the second set of storage cell is not correctly programmed, and in response to determining that one of the first set of storage cells and the second set of storage cells is not correctly programmed, separately program the first set of storage cells and the second set of storage cells.

In another example embodiment, the second block is physically displaced from the first block.

In one example, a system includes a set of non-volatile storage cells arranged into a string, the string connectable to a bit line and comprising a word line for each storage cell, and a controller configured to concurrently write data to two storage cells in the string by electrically selecting the bit line by setting a select gate transistor, electrically connecting a first word line corresponding to a first storage cell in the string with a second word line corresponding to a second storage cell in the string, and concurrently applying a programming pulse to the connected word lines to concurrently write the data to the first storage cell and the second storage cell.

In another example, the controller is further configured to, after concurrently applying the programming pulse to the first word line and second word line, concurrently apply a verify pulse to the first word line and second word line, sense current flowing through one of the first storage cell and the second storage cell in response to application of the verify pulse to concurrently determine that one of the first storage cell and the second storage cell is not correctly programmed, and in response to determining that one of the first storage cell and the second storage cell is not correctly programmed, separately program the first storage cell and the second storage cell.

In another example embodiment, the controller is further configured to determine that the first storage cell is correctly programmed, in response to determining that the first storage cell is correctly programmed, read data from the first storage cell, and after reading the data from the first storage cell, overwrite the first storage cell and the second storage cell.

In one example, the controller is further configured to read data from one of the first storage cell and the second storage cell, and use the data to program another cell in a cell to cell compaction operation as described herein.

In another example, the first storage cell and the second storage cell are consecutive storage cells in the string.

In one example embodiment, a method includes electrically selecting a bit line for a set of non-volatile storage cells arranged into two erase blocks, the bit line connectable to storage cells in each of the two blocks, electrically connecting separate word lines including a first word line corresponding to one of the storage cells in a first of the two blocks, and a second word line corresponding to one of the storage cells in a second of the two blocks; and concurrently applying a programming pulse to the connected word lines to concurrently program storage cells corresponding to the first word line and second word line in the two blocks to a common target threshold voltage.

In one example, the method further includes after concurrently applying the programming pulse to the connected word lines, concurrently applying a verify pulse to the connected word lines, sensing current flowing through the bit line in response to application of the verify pulse to determine that one of the storage cells is not correctly programmed, and in response to determining that one of the storage cells is not correctly programmed, separately program the storage cells.

In one example embodiment, the method further includes determining that a first of the storage cells is correctly programmed, in response to determining that the first of the storage cells is correctly programmed, reading the first of the storage cells, and after reading the first of the storage cells, overwriting the first of the storage cells and a second of the storage cells.

In another example embodiment, the method further includes reading data from one of a first storage cell of the storage cells within a first block of the two blocks, and a second storage cell of the storage cells within a second block of the two blocks, and using the data to program a another cell in a cell compaction operation.

In one example, a first of the two blocks is physically separated from a second of the two blocks.

In another example, an apparatus includes means for electrically selecting a bit line for storage cells in a set of non-volatile storage cells that are arranged into two blocks, the bit line may be connected to a first string of storage cells in a first of the two blocks and a second string of storage cells in a second of the two blocks, the first string and the second string each comprising a set of word lines, means for electrically connecting a first word line included in the first string with a second word line included in the second string, the first word line and the second word line corresponding, respectively, to a first storage cell included in the first string and a second storage cell included in the second string, and means for applying a single programming pulse to the connected word lines to concurrently program the first storage cell in the first string and the second storage cell in the second string to a common target threshold voltage.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 11 depicts one embodiment of the die controller of FIG. 1B.

DETAILED DESCRIPTION

Figure 1A:
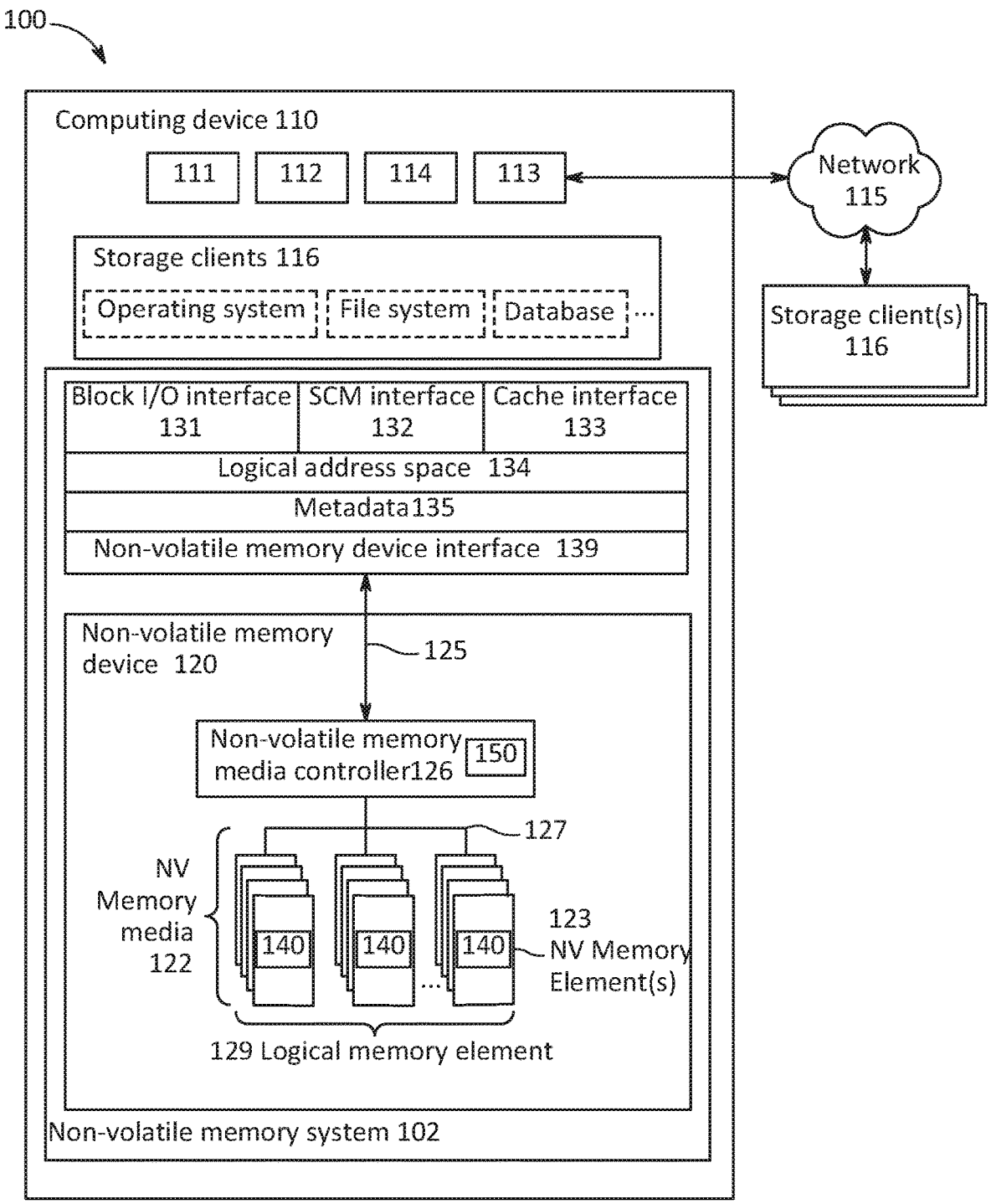
FIG. 1A is a block diagram of one embodiment of a system including a concurrent programming component for a non-volatile memory device.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the hardware units described in this specification have been labeled as circuits, in order to more particularly emphasize their implementation independence. For example, a circuit may be a custom VLSI circuit or gate array, all or part of an off-the-shelf semiconductor such as a logic chips, transistor, or other discrete component. A circuit may also be implemented in programmable hardware devices such as field programmable gate arrays, programmable array logic, programmable logic devices, or the like. Notably, where multiple circuits are recited, they may, in some instances, share hardware elements; thus, two different circuits may be embodied as a single body of hardware that is configured, via software or distinct hardware elements, to perform the recited functions of the two circuits.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, is a tangible, physical, non-transitory device. For example, a component may be implemented as a hardware logic circuit with custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may include one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," "one example embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only, and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 with a concurrent programming component 150 for a non-volatile memory device 120. The concurrent programming component 150 may be part of and/or in communication with a non-volatile memory media controller 126 (as depicted in FIG. 1A), a non-volatile memory element 123, a device driver, or the like. The concurrent programming component 150 may operate on a non-volatile memory system 102 of a computing device 110, which may include a processor 111, volatile memory 112, and a network interface 113. The processor 111 may include one or more central processing units, one or more general-purpose processors, one or more application-specific processors, one or more virtual processors (e.g., the computing device 110 may be a virtual machine operating within a host), one or more processor cores, or the like. The network interface 113 may include one or more network interfaces configured to communicatively couple the computing device 110 and/or non-volatile memory media controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 includes one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may include one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the communications network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a communications network 115, such as an Ethernet network, an Infiniband network, SCSI RDMA over a communications network 115, a storage area network (SAN), a local area network (LAN), a wide area network (WAN) such as the Internet, another wired and/or wireless network, or the like.

The computing device 110 may further include a non-transitory, computer readable storage medium 114. The computer readable storage medium 114 may have executable instructions configured to cause the computing device 110 (e.g., processor 111) to perform steps of one or more of the methods disclosed herein. Alternatively, or in addition, the concurrent programming component 150 may be embodied as one or more computer readable instructions stored on the computer readable storage medium 114.

The non-volatile memory system 102, in the depicted embodiment, includes a concurrent programming component 150. As will be further described, the concurrent programming component 150 may be configured to electrically select a bit line for a set of non-volatile storage cells arranged into the same block or into two different blocks, electrically connect separate word lines that correspond to storage cells, and apply a programming pulse to the connected word lines to concurrently program the storage cells that correspond to the separate word lines to a common target threshold voltage. The storage cells may optionally be located in two different blocks, which may be physically separated from each other within the memory array to minimize the probability that an error occurring in one of the storage cells will also be present in the other storage cell. As used herein, "electrically select" includes the application of an electric potential allowing a current source to transfer to another component. In one example, electrically selecting a bit line includes setting one or more hardware components to connect the bit line to another component.

The concurrent programming component 150 may concurrently program separate cells in separate blocks with the same data and to a common target threshold voltage. In some embodiments, concurrently writing the same data to separate blocks provides increased performance because if one block fails to store the written data, the data may be recovered from the other block without requesting the data again from the non-volatile memory media controller 126. This allows the system 100 to move on to other operations more quickly because of the need for fewer requests from the non-volatile memory media controller 126.

Furthermore, in some embodiments, a cell compaction operation that uses two copies of the same data may use the same data in the separate blocks without the non-volatile memory media controller 126 having to separately write another copy of the data. This simplifies the operations performed by the non-volatile memory media controller 126 engaged in MLC, TLC, QLC programming, or the like.

In one example embodiment, the concurrent programming component 150 writes the same data to blocks that are located in physically separate regions. The separate regions may be defined by distance, a number of blocks between the selected blocks, and/or the like. As one skilled in the art may appreciate, an array of NAND cells may fail at particular physical locations or areas. Writing the same data to physically remote areas of the NAND array provides increased protection against failure because if a particular portion of the NAND array fails, a second copy of the data existing in a different physical location will likely be unaffected. As described herein, in some embodiments, this benefit does not cost extra operations because the concurrent programming component 150 writes both copies of the same data concurrently (e.g., it takes no extra time to write the same data to the second cell as compared with writing the data to the first cell).

In another example embodiment, the concurrent programming component 150 writes the same data to two separate cells in the same string. Concurrently programming multiple cells in a string to a common target threshold voltage may provide similar benefits as writing to separate blocks. In addition to the benefits previously described, concurrently programming two consecutive cells in a string to a common target threshold voltage may reduce electrical interference because the two word lines corresponding to the same cells programmed experience the same voltage bias at the same time. Furthermore, word line to word line capacitance is decreased in this scenario. The concurrent programming component 150 may write the same data to cells in the string at different locations to provide physical separation as previously described in connection with concurrently writing to separate blocks.

In another example embodiment, after verifying that a first cell has been correctly programmed, the concurrent programming component 150 may discard the data in the second cell. The concurrent programming component 150 may accomplish this by erasing the second cell, flag the second cell for reuse, or overwriting the second cell using other data. Additionally or alternatively, the data in both cells may be retained until used, for example for a cell compaction operation in which the data is combined with other data and stored in a multiple-level cell (MLC) or the like (e.g., a TLC, QLC, etc.).

In some embodiments, an SLC-TLC compaction operation (one example of a cell compaction operation) may be used after the data for a multiple level cell (MLC), such as a triple level cell (TLC), has been temporarily stored in a series of SLC cells. In some embodiments, three pairs of SLC cells may be used to store the data for the TLC, with each pair storing identical versions of the data for a single bit to be stored in the TLC, for data redundancy purposes. In SLC-TLC compaction, the data from at least one SLC cell from each of the three pairs of SLC cells may be read and encoded into a bit within the TLC, such that three bits are encoded on the TLC. The bits encoded in the TLC may optionally be compared with those of the three pairs of SLC's to confirm that the TLC has been properly programmed. Then, once the TLC has been properly programmed, the SLC's may be erased. The same SLC cells may then be used as a buffer for TLC programming, with built-in temporary data redundancy.

After the cell compaction operation, the first and second cells may both be erased. A new programming operation may be used to program the cells with new data, for example, to be used in another SLC-TLC compaction operation. The combination of erasing data from cells and programming the cells with new data (or making a determination not to program the cells, if the new data to be stored involves retention of the cells in the erased, or un-programmed, state) is referred to as "overwriting" the contents of the cells.

As used herein, a "block" comprises a set of word lines wherein each word line connects to a set of storage cells. In one example embodiment, a "block" comprises a portion of an array of storage cells (e.g., non-volatile memory elements), wherein the storage cells are connected in such a way so as to allow erasing all of the storage cells in the block in a single operation. Those of skill in the art will recognize that a block is the smallest unit of storage cells erasable using a single storage/memory erase command and in certain embodiments may be referred to as "erase blocks". In certain embodiments, a "block" includes a set of strings of non-volatile memory elements.

As used herein, a "NAND string" comprises a set of NAND storage cells electrically connected in series by a channel to a bit line. A "channel" includes an electrical connection connecting storage cells in a string to their respective bit lines and source lines (e.g., FIG. 5: channel 665). A NAND string of storage cells also includes a word line for each of the storage cells in the string. As used herein, a "bit line" includes a line of conductive material that is connectable to a voltage source and connectable to ends of various strings (e.g. via channels) in a block of storage cells. In one example, a block includes 64 strings and a separate bit line is connectable to each of the 64 strings. In another example, a bit line traverses through many blocks and is connectable to corresponding strings in each block.

As used herein, "intersecting" comprises two components (e.g., word lines, bit lines, storage cells, etc.) that are physically arranged so that they may electrically affect each other. A word line intersecting with a storage cell means that the word line is electrically connected to the storage cell so that application of a programming pulse to the word line programs the storage cell.

As used herein, a "word line" comprises a line of conductive material that facilitates the transmission of electrons from a voltage source, through storage cells in a set of strings, and to a current drain. In one example, a word line intersects a corresponding storage cell in each of set of strings configured in a block of storage cells.

As used herein "electrically connectable" includes two components (e.g., word lines, bit lines, storage cells, etc.) configured and/or positioned to be readily connected to permit electric current to pass between them. Electrical connectability may involve the use of a secondary component to connect the electrically connectable components. In one example, a gate transistor may be set to electrically connect a word line to a voltage source. Thus, the word line and the voltage source are electrically connectable to each other, but are not electrically connected to each other unless the gate transistor connects them.

As used herein "concurrently program," "concurrently programming," "concurrently applying a program(ing) pulse," or the like means applying a programming pulse to two separate storage cells at substantially the same time. "Substantially the same time" means that the two cells are programmed from the same programming pulse, although, due to physical locations, or electrical distance, the storage cells may not receive the programming pulse at exactly the same time. In one example, due to a physical distance from a source for the programming pulse, a first storage cells may receive the programming pulse before the second storage cell. In another example embodiment, the two storage cells receive the programming pulse at the same time, however, the first storage cell is successfully programmed before the second storage cell. Furthermore, concurrently programming multiple storage cells to a common target threshold voltage, means applying a common voltage to each of the storage cells at substantially the same time. Of course, as one skilled in the art may appreciate, this does not necessarily mean that the storage cells are successfully programmed to a target threshold voltage as a result of the same pulse.

In one embodiment, the concurrent programming component 150 may include logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the concurrent programming component 150 may include executable software code, such as a device driver or the like, stored on the computer readable storage medium 114 for execution on the processor 111. In a further embodiment, the concurrent programming component 150 may include a combination of both executable software code and logic hardware.

In one embodiment, the concurrent programming component 150 is configured to receive storage requests from a device driver or other executable application via a bus 125 or the like. The concurrent programming component 150 may be further configured to transfer data to/from a device driver and/or storage clients 116 via the bus 125. Accordingly, the concurrent programming component 150, in some embodiments, may include and/or be in communication with one or more direct memory access (DMA) modules, remote DMA modules, bus controllers, bridges, buffers, and so on to facilitate the transfer of storage requests and associated data. In another embodiment, the concurrent programming component 150 may receive storage requests as an API call from a storage client 116, as an IO-CTL command, or the like.

According to various embodiments, a non-volatile memory media controller 126 in communication with one or more program sequencing components 140 may manage one or more non-volatile memory devices 120 and/or non-volatile memory elements 123. The non-volatile memory device(s) 120 may include recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may include a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients operating on the computing device 110 and/or remote, storage clients 116 accessible via the communications network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may include one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may include a plurality of logical addresses, each corresponding to respective media locations of the one or more non-volatile memory devices 120. A device driver may maintain metadata 135 including any-to-any mappings between logical addresses and media locations, or the like.

A device driver may further include and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a communications network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The network interface 113 may include one or more network interfaces configured to communicatively couple the computing device 110 and/or the non-volatile memory media controller 126 to a communications network 115 and/or to one or more remote, network-accessible storage clients 116. The storage clients 116 may include local storage clients operating on the computing device 110 and/or remote, storage clients 116 accessible via the communications network 115 and/or the network interface 113. The non-volatile memory media controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may include one or more non-volatile memory elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), spin-transfer torque (STT) MRAM, spin orbit torque SOT-MRAM, magnetic storage media (e.g., hard disk, tape), optical storage media, and/or the like. The one or more non-volatile memory elements 123 of non-volatile memory media 122, in certain embodiments, include storage class memory (SCM). Examples herein refer to NAND memory, or more particularly, SLC NAND memory; however, the systems and methods provided herein may be applied to other memory types, including but not limited to those listed above.

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may include one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, MANOS memory, PMC memory, CBRAM, MRAM, and/or variations thereof.

While the non-volatile memory media 122 is referred to herein as "memory media," in various embodiments, the non-volatile memory media 122 may more generally include one or more non-volatile recording media capable of recording data, which may be referred to as a non-volatile memory medium, a non-volatile storage medium, or the like. Further, the non-volatile memory device 120, in various embodiments, may include a non-volatile recording device, a non-volatile memory device, a non-volatile storage device, or the like.

The non-volatile memory media 122 may include one or more non-volatile memory elements 123, which may include, but are not limited to: chips, packages, planes, die, or the like. A non-volatile memory media controller 126 may be configured to manage data operations on the non-volatile memory media 122, and may include one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may include an I/O bus for communicating data to/from the non-volatile memory elements 123. The bus 127 may further include a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory media controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also physically adjacent (e.g., WL0, WL1, WL2, . . . WLN).

The non-volatile memory media controller 126 may include and/or be in communication with a device driver executing on the computing device 110. A device driver may provide storage services to the storage clients 116 via one or more interfaces 131, 132, and/or 133. In some embodiments, a device driver provides a block I/O interface 131, or device interface, through which storage clients 116 perform block-level I/O operations. Alternatively, or in addition, a device driver may provide a storage class memory (SCM) interface 132, which may provide other storage services to the storage clients 116. In some embodiments, the SCM interface 132 may include extensions to the block I/O interface 131 (e.g., storage clients 116 may access the SCM interface 132 through extensions or additions to the block I/O interface 131). Alternatively, or in addition, the SCM interface 132 may be provided as a separate API, service, and/or library. A device driver may be further configured to provide a cache interface 133 for caching data using the non-volatile memory system 102.

A device driver may further include a non-volatile memory device interface 139 that is configured to transfer data, commands, and/or queries to the non-volatile memory media controller 126 over a bus 125, as described above.

Figure 1B:
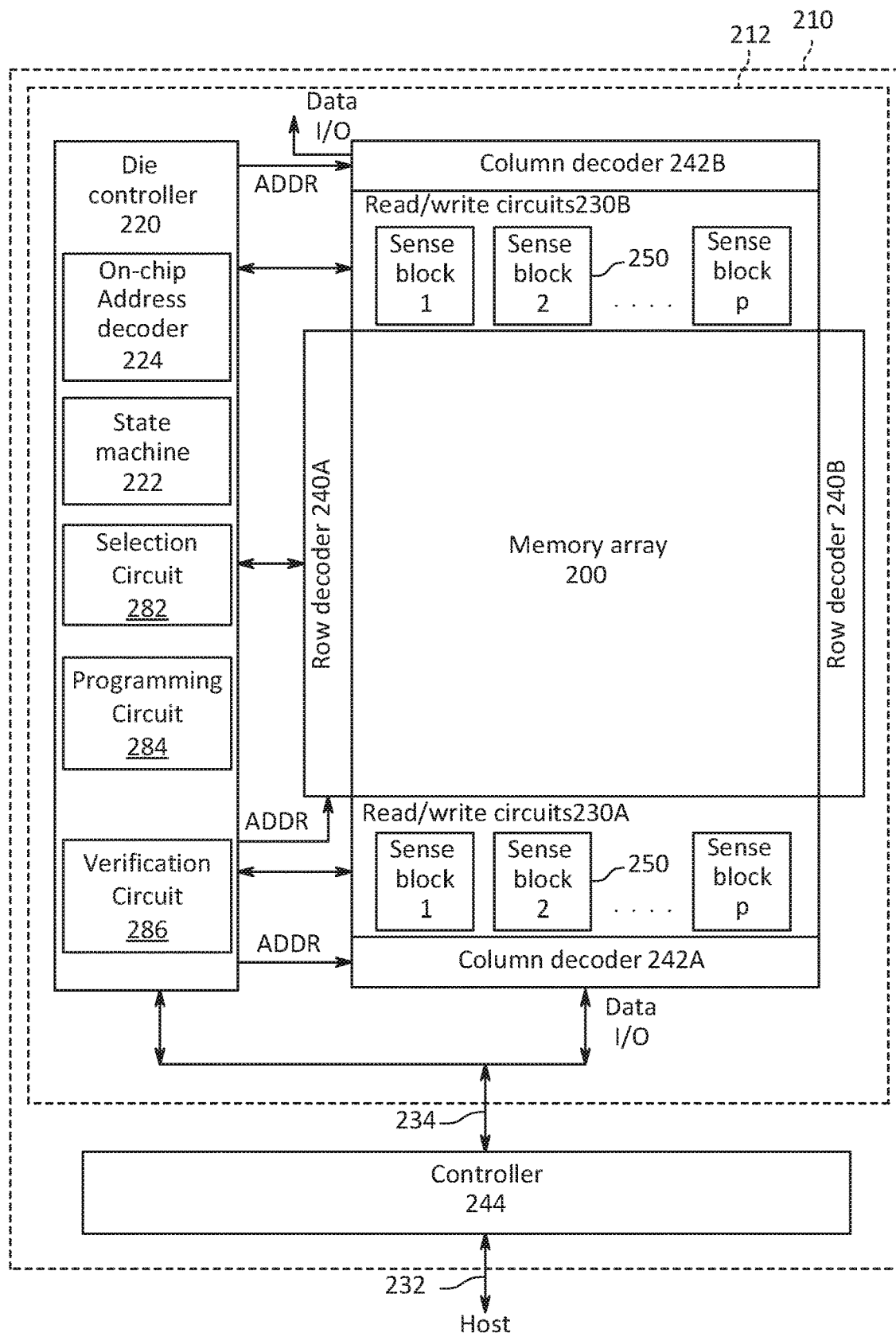
FIG. 1B illustrates an embodiment of a non-volatile storage device that may include one or more memory die or chips.

FIG. 1B illustrates an embodiment of a non-volatile storage device 210 that may include one or more memory die 212 or chips. Memory die 212, in some embodiments, includes a memory array 200 (two-dimensional or three dimensional) of memory cells, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same non-volatile storage device 210 (e.g., a removable storage card or package) as the one or more memory die 212. Commands and data are transferred between the host and controller 244 via lines 232 and between the controller and the one or more memory die 212 via lines 234. One implementation can include multiple memory die 212.

The die controller 220 may share a die with the memory array 200, such that the die controller 220 constitutes an "on-die" controller. The die controller 220 may have any form known in the art, including but not limited to microprocessors, microcontroller units (MCU's), finite state machines (FSM's), central processing units (CPU's), graphics processing units (GPU's), and the like; an "on-die controller" or a "controller" may both refer to any of these.

Die controller 220, in one embodiment, cooperates with the read/write circuits 230A/230B to perform memory operations on the memory array 200. The die controller 220, in certain embodiments, includes a concurrent programming component 150, a state machine 222, and an on-chip address decoder 224. In one embodiment, the state machine 222 forms a portion of the concurrent programming component 150. In a further embodiment, the controller 244 forms a portion of the concurrent programming component 150. The controller 244 may optionally be positioned on one or more of the memory die 212, or may be on a die separate from the memory die 212.

In some embodiments, each of the memory arrays 200 may be an SLC (single-level cell) NAND array, in which each of the non-volatile memory elements 123, or "non-volatile storage cells," is programmable via application of a programming pulse across the cell. Each of the memory arrays 200 may further be programmable with a single pulse, providing speeds that approach the theoretical limit for programming NAND. As known in the art, each of the non-volatile memory elements 123 may have an electrically insulative element, such as a gate oxide layer or tunnel oxide layer, through which electrons are selectively movable, that provides a gate function by allowing the cells to be programmed with a charge and to retain the charge with which they are programmed. An "insulative element" or "insulative layer" may include any structure that is designed to selectively permit electrical charge to enter and/or leave a non-volatile storage cell.

The phrase "programming pulse" refers to an electrical pulse applied to the non-volatile memory elements 123 which causes the non-volatile memory elements 123 to enter, or progress towards, a programmed state. This may be a peak voltage value, root mean square ("RMS") voltage value, an average voltage of a pulse, a voltage value of a particular pulse in a pulse train, and/or the like. In another example embodiment, a programming pulse includes an application of current including a peak current, an RMS current value, an average current of a pulse, or a particular current train, or the like. "Programming pulse" is not limited to NAND memory, but may be applied to any non-volatile memory that is programmed through the application of an electrical potential. Thus, programming settings such as programming pulse may be adjusted, through use of the systems and methods of the present disclosure, in non-volatile memory types including, but not limited to, the non-volatile memory types listed in the background section above.

The phrase "verify pulse" includes an electric pulse applied to a non-volatile memory element 123 (e.g., a storage cell) whereby the flow of current indicates whether the storage cell has been sufficiently programmed. A verify pulse may or may not be the same for different storage cells.

Similarly, various "sensing settings" may be used to sense the contents of one or more non-volatile memory elements 123 of the memory array 200. The term "sensing" refers to not just non-volatile memory structures with cells that hold electrical charge, but also to non-volatile memory types in which a different storage mechanism is used. For example, in some non-volatile memory types, a voltage and/or current is used to sense the resistance level of the cell (rather than stored charge). In other non-volatile memory types, current flow through the cell is detected; a current level above or below a particular threshold may indicate that a cell is programmed. Where the contents of individual cells are to be ascertained, this may be referred to as "reading" the cells. However, "sensing" the contents of a non-volatile memory array may include reading the contents of individual cells, or detecting individual or collective properties of the cells, such as whether the voltage or resistance of the cells is over or under a predetermined a threshold.

In some embodiments, modifying the programming settings may include reducing the programming voltage applied across the non-volatile memory elements 123 one or more times during the operating life of the non-volatile memory device 120, to extend the useful life of the non-volatile memory device 120 and reduce the likelihood of erroneous data reads due to cell over-programming.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the concurrent programming component 150.

In one embodiment, one or any combination of die controller 220, concurrent programming component 150, on-chip address decoder 224, state machine 222, decoders 242A, decoders 242B, decoders 240A, decoders 240B, read/write circuits 230A, read/write circuits 230B, and/or controller 244 can be referred to as one or more managing circuits. In one example embodiment, the die controller 220 includes any of a selection circuit 282, a program circuit 284, and a verify circuit 286.

In another example embodiment (not depicted in FIG. 1B), the selection circuit 282, the programming circuit 284, and the verification circuit 286 are implemented as part of the controller 244. In yet another example embodiment, the die controller 220 comprises one or more of the circuits 282, 284, 286 and the controller 244 comprises one or more of the circuits 282, 284, 286. Therefore, it is not necessary that the various circuits 282, 285, 286 are implemented on either the die controller 220 or the controller 244.

The selection circuit 282 may be configured to electrically select a first set of storage cells in the first erase block and a second set of storage cells in the second erase block. In one example, the non-volatile memory media controller 126 is set to write data to a first erase block and at a given depth of memory cells (e.g., the top row of storage cells in the block, or another row). The concurrent programming component 150, in another example embodiment, sets a set of select gate transistors to connect bit lines for strings that include the storage cells and connect a programming pulse source to word lines that correspond to the storage cells. Furthermore, the selection circuit 282 may similarly connect word lines in a second erase block to the voltage source, such that, upon application of the voltage source, the voltage is concurrently applied to both the first word line in the first erase block and the second word line in the second erase block. In a specific example, the selection circuit 282 sets one or more select gate transistors to connect word lines to source select gates and drain select gates.

In certain embodiments, the selection circuit 282 selects word lines corresponding to the same row in the first erase block with the same row in the second erase block. However, this is not necessarily the case as the selection circuit 282 may select any word line in the block.

In another example embodiment, the programming circuit 284 is configured to apply a programming pulse, at an elevated voltage, to memory cells of the first word line and memory cells of the second word line to concurrently write the same data, in a single pulse, to the storage cells in the first erase block and the storage cells in the second erase block. In some example embodiments, the first word line and the second word line are separate word lines at different physical locations. In other example embodiments, the first word line and the second word line are the same physical word line. In one example, the first erase block and the second erase block may comprise neighboring erase blocks and share the same physical word line while the memory cells being concurrently programmed have different memory channels.

In one example embodiment, the verification circuit 286 is configured to apply a verify pulse to the first word line and second word line. The verification circuit 286 prepares sense blocks 250 connected to bit lines for a verify operation. The verification circuit 286 then senses an amount of current flowing from the sense amplifiers through the storage cells that received the programming pulse. In one embodiment, if current flows through one of the two cells in response to application of the verify pulse, then the threshold voltage for one of cells has not reached the target level. The cell was not sufficiently programmed. If one or more of the cells has not reached the target level, the verification circuit 286 may initiate another program procedure as described herein. In one example embodiment, sensing an amount of current comprises determining whether any current flows.

In another example embodiment, sensing current comprises measuring current and determining whether the measured current is above a threshold amount of current (e.g., 0 Amps). In one example, sensing current includes sensing current at a bit line connected to NAND strings that include the storage cells being programmed. In this example embodiment, while current may flow through the bit line, because the bit line may be connected to multiple NAND strings, it may not be known through which NAND string the current is flowing.

In another example, sensing current includes sensing current at a current sensing component attached to the NAND string. In another example embodiment, sensing current includes sensing current at the respective storage cells. Of course, one skilled in the art may appreciate a wide variety of different architectures and sensing current may be performed in different ways.

In one example embodiment, the programming circuit 284 programs the first storage cell and separately programs the second storage cell in response to sensing current in response to applying the verify pulse.

Figure 8:
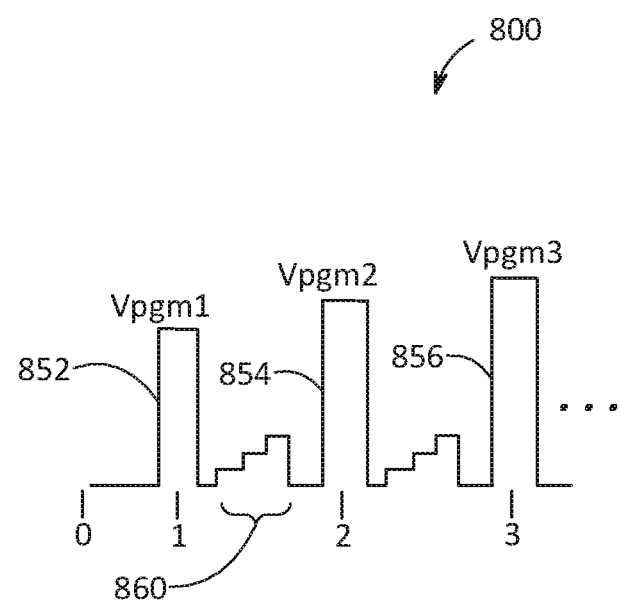
FIG. 8 depicts a waveform of an example programming operation.

The separate programming procedure may include applying programming loops at successively increasing voltages to the first storage cell as one skilled in the art may appreciate. In another example embodiment, the separate programming procedure includes applying the programming loops to the second storage cell after applying the programming loops to the first storage cell and verifying that the first cell is correctly programmed. An "increased" programming pulse suggests that a previous programming pulse was not sufficient to correctly program a particular storage cell, and a programming pulse is "increased" (e.g., at a higher voltage) to retry to program the storage cell. Thus, "correctly programmed" means that the application of a programming pulse has caused a threshold voltage level for a particular storage cell to be above a threshold value or to be within a threshold range. One specific example of such a series of programming pulses is depicted in FIG. 8 and will be described hereafter.

In another example embodiment, the concurrent programming component 150 is configured to determine whether the first and/or second storage cells are correctly programmed, and, in response to determining that the first and/or second storage cells are correctly programmed, initiate overwriting of the first and/or second storage cells. In some examples, the concurrent programming component 150 flags the second storage cell for reuse, initiates erasure of the second storage cell, repurposes the second storage cell, and/or the like.

In one example embodiment, the concurrent programming component 150 is configured to read data from one of the first storage cell and the second storage cell and use the data to program a multi-level cell in an SLC-TLC compaction operation. As previously described, having two copies of the same data allows the concurrent programming component 150 to perform a multi-level cell SLC-TLC compaction operation without having to make a copy of the data stored in the cells. The data stored in the first and second storage cells may thus be for temporary use. Having two copies of the data may help to prevent data loss during the time between initial storage of the data in the memory array 200 and the use of the data in the SLC-TLC compaction operation.

In another example embodiment, the concurrent programming component 150 uses two storage cells along a single string. In this example embodiment, a string comprises a set of storage cells. The string may be connected to a bit line and intersects a separate word line for each of the two storage cells along the string. Similarly, as previously described, the concurrent programming component 150 may select two separate word lines corresponding to two separate storage cells along the string to be concurrently programmed to a common target threshold voltage.

In one embodiment, the selected word lines may optionally be separated from each other such that they are at different locations along the string. For example, the selected word lines may be at opposite ends of the string. As described previously, such displacement may help reduce the risk of data loss by reducing the likelihood that the storage cells will be affected by a common disruption.

In another example embodiment, the concurrent programming component 150 connects separate word lines in more than two distinct erase blocks, whereby application of a programming pulse to the connected word lines applies the programming pulse to storage cells in each of the distinct erase blocks.

In this example embodiment, the selection circuit 282 electrically selects the bit line by setting a select gate transistor, or through the use of one or more other components, as one skilled in the art may appreciate. The selection circuit 282 then electrically connects a first word line corresponding to a first storage cell in the string with a second word line corresponding to a second storage cell in the string. The programming circuit 284 then applies a programming pulse to the connected word lines to concurrently write the data to the first storage cell and the second storage cell in the string.

In another example embodiment, the verification circuit 286, after the programming circuit 284 concurrently applies the programming pulse to the first word line and second word line, applies a verify pulse to the first word line and second word line to determine whether the first storage cell and/or the second storage cell were correctly programmed. In response to current flowing through the string, the verification circuit 286 determines that one or more of the first storage cell and the second storage cell did not fully program (e.g., has an insufficient voltage level). In response to this determination, the verification circuit 286 may then begin a subsequent programming procedure for each storage cell in any way as described herein.

In some embodiments, the verification circuit 286 does not determine whether any specific storage cell has been correctly programmed, but rather determines, by sensing current in the bit line shared by both storage cells, that one of the storage cells has not been correctly programmed. In response to this determination, the programming circuit 284 programs the first and second storage cells again. Since both storage cells are programmed, there may be no need to determine which storage cell(s) were not correctly programmed.

In one example embodiment, the first storage cell in the string and the second storage cell in the string are consecutive storage cells in the string. Although there are benefits to physical displacement between the storage cells in which duplicate data is stored, there are also benefits to concurrently programming consecutive word lines on a string to a common target threshold voltage. In some embodiments, two word lines storing the same data may tend to have less likelihood of electromagnetic interference with each other.

Figure 2A:
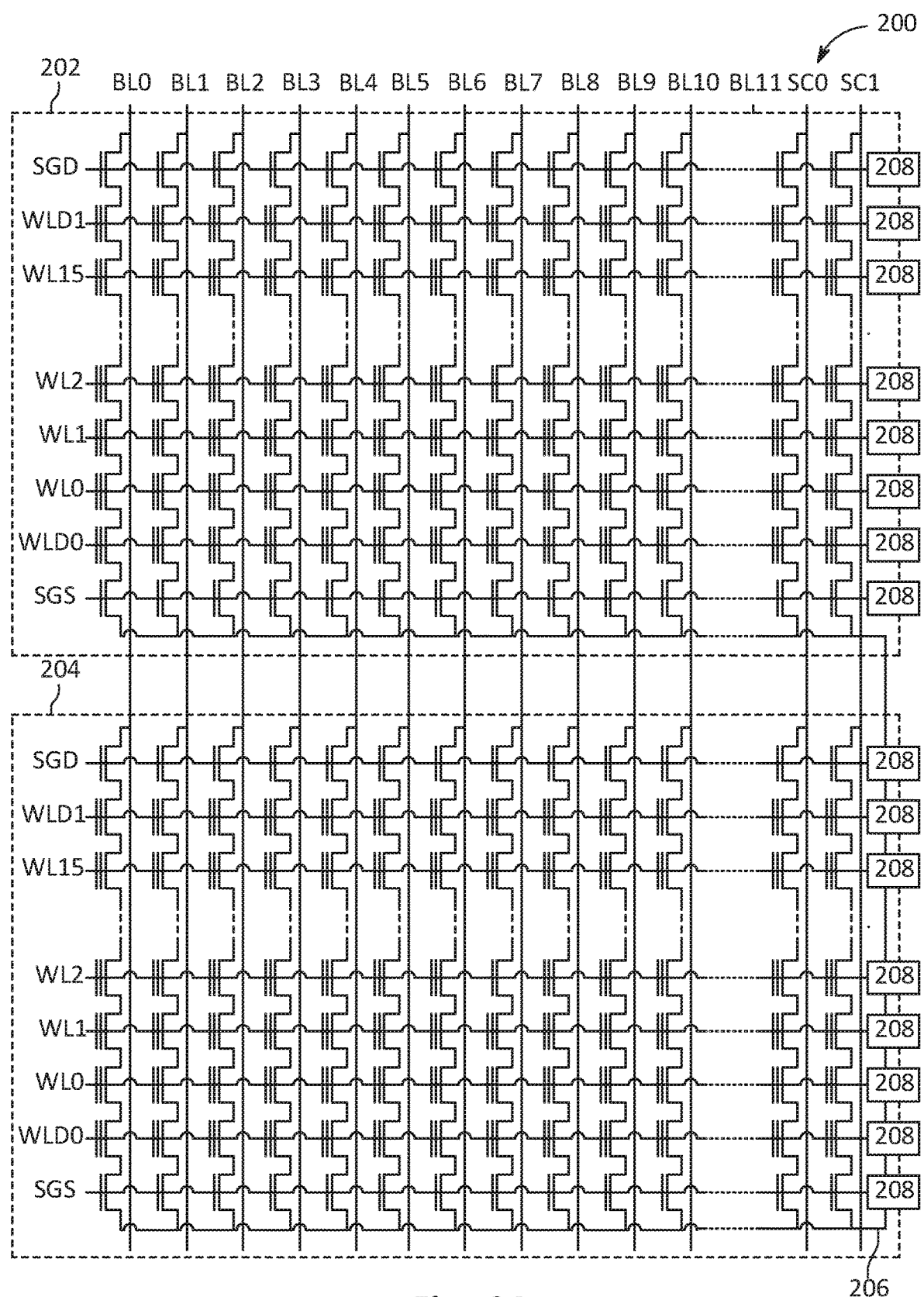
FIG. 2A depicts blocks of memory cells in an example 2D configuration of the memory array of FIG. 1.

FIG. 2A depicts blocks of memory cells in an example 2D configuration of the memory array 200 of FIG. 1B. The memory array 200 can include many blocks. Each example block 202, 204 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate SGS which, in turn, is connected to a common source line 206. Sixteen word lines, for example, WL0-WL15, extend between the source select gates and the drain select gates.

In some cases, dummy word lines, which contain no user data, can also be used in the memory array adjacent to the select gate transistors (SGS/SGD). Such dummy word lines can shield an edge data word line from certain edge effects. In some examples, dummy word lines are positioned adjacent to the SGD and SGS lines. Thus, in the exemplary embodiment of FIG. 2A, dummy word lines WLD0 are positioned adjacent to the SGS lines of each of the blocks 202, 204, and dummy word lines WLD1 are positioned adjacent to the SGD lines of each of the blocks 202, 204. In other examples, multiple (for example, two or three) dummy word lines are positioned between the word lines WL0 through WL15 and each of the SGD and SGS lines. In some embodiments, the dummy word lines are not erased with the rest of the block 202, 204 to which they belong. Thus, any data stored on the dummy word lines will persist through the erase operations customarily used to erase user data, and can only be modified by programming bits of the dummy word lines that have not yet been programmed.

As embodied in FIG. 2A, the bit lines BL0, BL1, . . . define columns of the word lines of each block 202, 204. In addition to the bit lines BL0, BL1, . . . that store user data, each block 202, 204 has a plurality of spare columns SC0, SC1, . . . , that may be used for various purposes, such as the replacement of the bit lines BL0, BL1, . . . that are, or become, unusable. As such, the spare columns, in some instances, do not store user data.

Each of the word lines of the memory array 200 may have a word line driver 208 that decodes and/or otherwise processes the data from that word line. Thus, in FIG. 2A, the word lines WL0 through WL15 may have word line drivers 208, as shown. The word line drivers 208 may be included in the row decoders 240A/240B shown in FIG. 1B.

The non-volatile memory elements 123 may include any of a wide variety of technologies, including but not limited to all of the non-volatile memory types referenced in the background above. One type of non-volatile memory which may be provided in the memory array is a charge-trapping memory cell. Other types of non-volatile memory can also be used. For example, a charge-trapping memory cell may use a non-conductive dielectric material in place of a conductive floating gate to store charge in a non-volatile manner. In an example, a triple layer dielectric formed of silicon oxide, silicon nitride and silicon oxide ("ONO") is sandwiched between a conductive control gate and a semiconductor. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
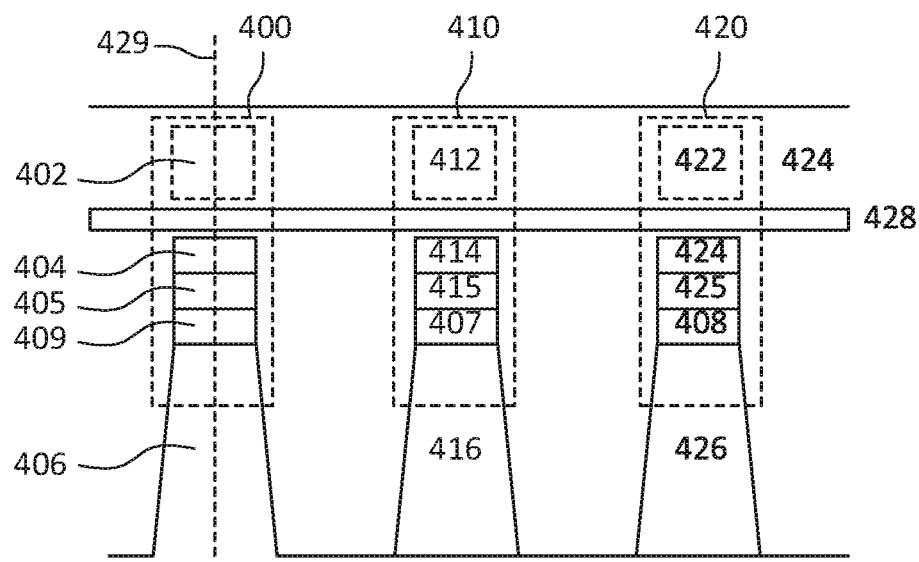
FIG. 2B depicts a cross-sectional view of example charge-trapping memory cells in NAND strings, as an example of memory cells in FIG. 2A.

FIG. 2B depicts a cross-sectional view of example charge-trapping memory cells in NAND strings, as an example of memory cells in FIG. 2A. The view is in a word line direction of memory cells comprising a flat control gate and charge-trapping regions as a 2D example of memory cells in the memory array 200 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an Inter Poly Dielectric (IPD) layer 428, charge-trapping layers 404, 414 and 421, polysilicon layers 405, 415 and 425 and tunneling layers 409, 407 and 408. Each charge-trapping layer extends continuously in a respective NAND string.

A memory cell 400 includes the control gate 402, the charge-trapping layer 404, the polysilicon layer 405, and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

One advantage of a flat control gate is that the charge-trapping layer can be made thinner than a floating gate. Additionally, the memory cells can be placed closer together.

Figure 2C:
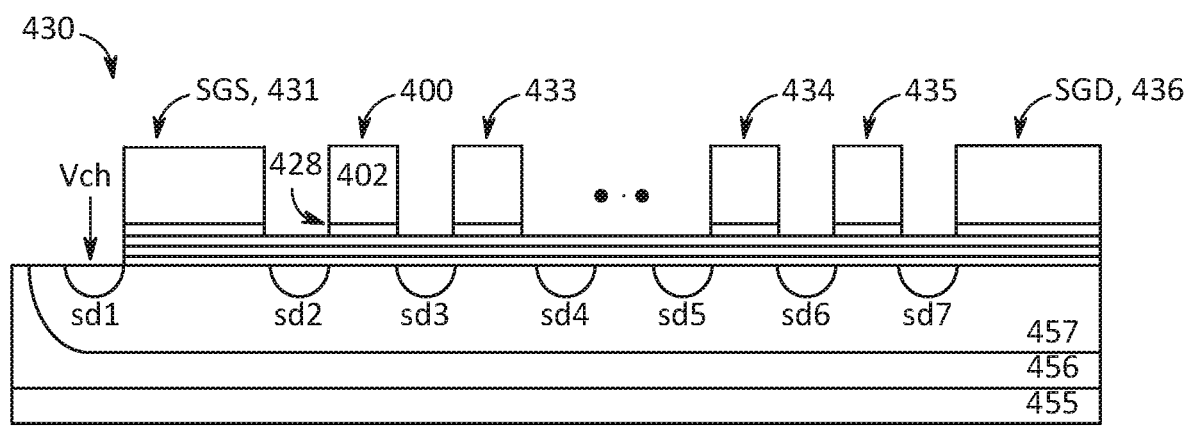
FIG. 2C depicts a cross-sectional view of the structure of FIG. 2B.

FIG. 2C depicts a cross-sectional view of the structure of FIG. 2B along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel region 406.

Figure 2D:
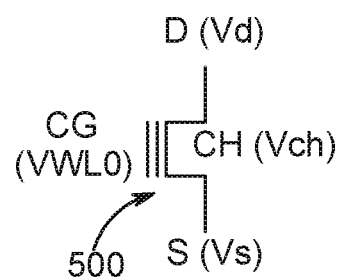
FIG. 2D depicts an example memory cell.

FIG. 2D depicts an example memory cell 500. The memory cell comprises a control gate CG which receives a word line voltage Vwll0, a drain at a voltage Vd, a source at a voltage Vs and a channel at a voltage Vch.

Figure 3:
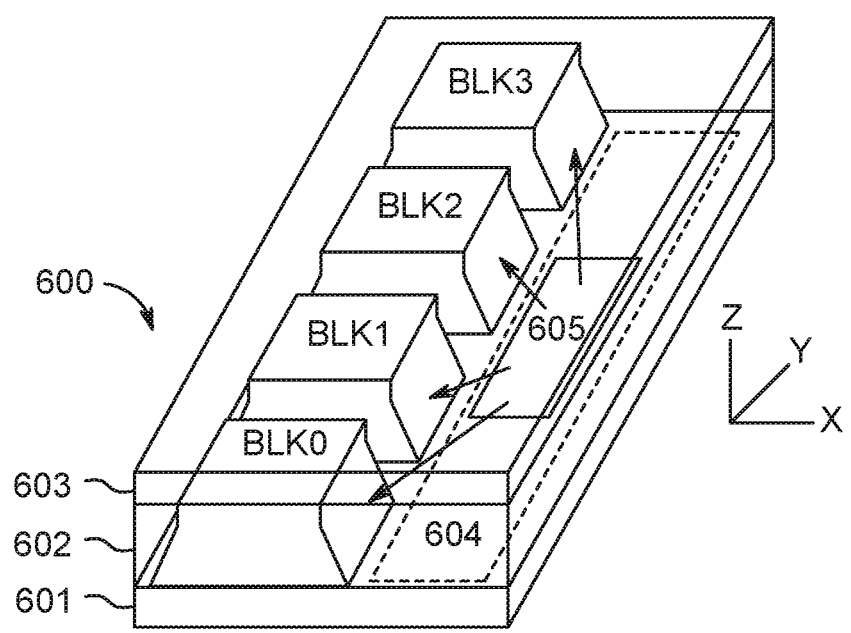
FIG. 3 is a perspective view of a memory device comprising a set of blocks in an example 3D configuration of the memory array of FIG. 1.

FIG. 3 is a perspective view of a memory device 600 comprising a set of blocks in an example 3D configuration of the memory array 200 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
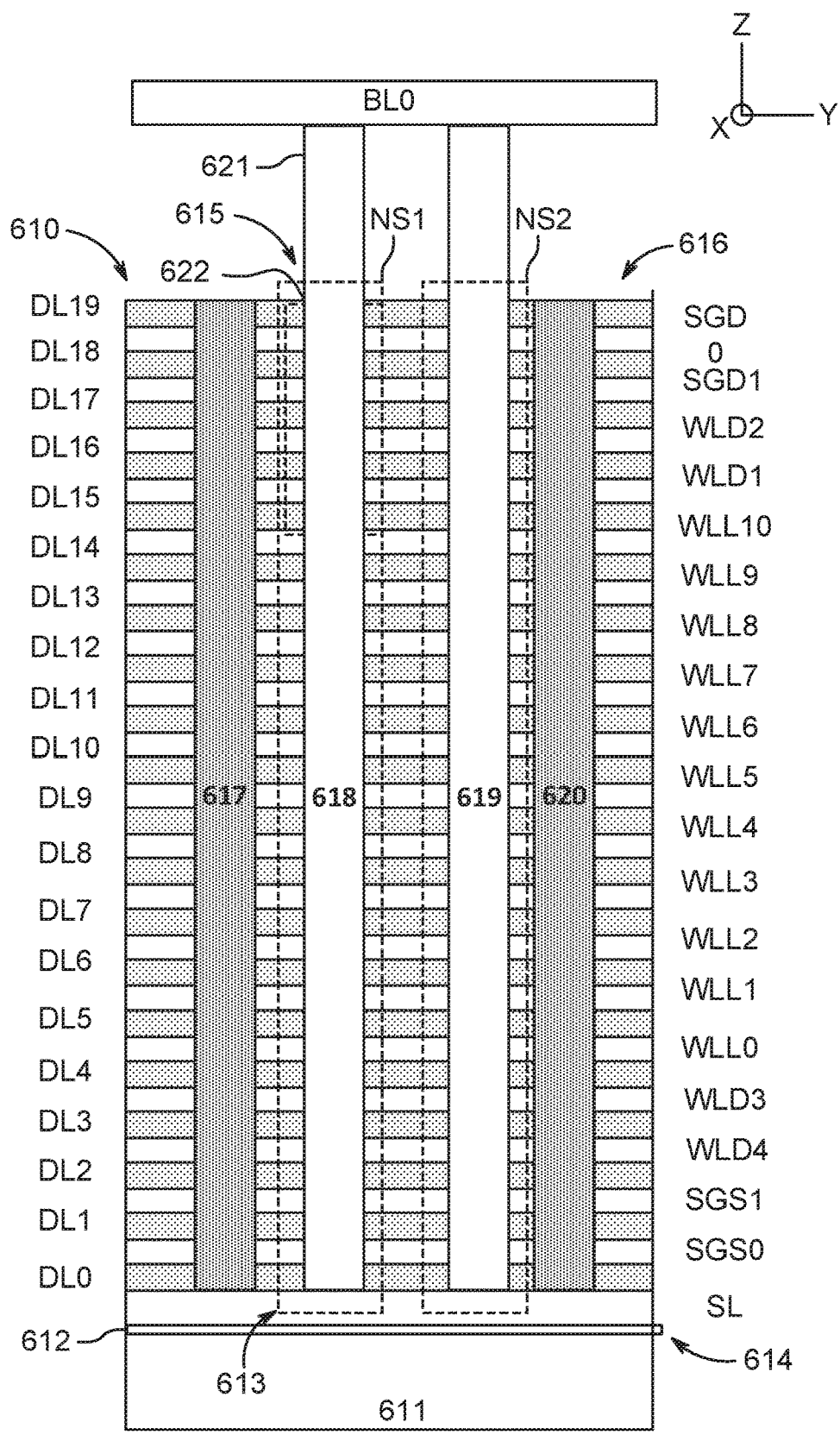
FIG. 4 depicts an example cross-sectional view of a portion of one of the blocks of FIG. 3.

FIG. 4 depicts an example cross-sectional view of a portion of one of the blocks of FIG. 3. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 5.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 5:
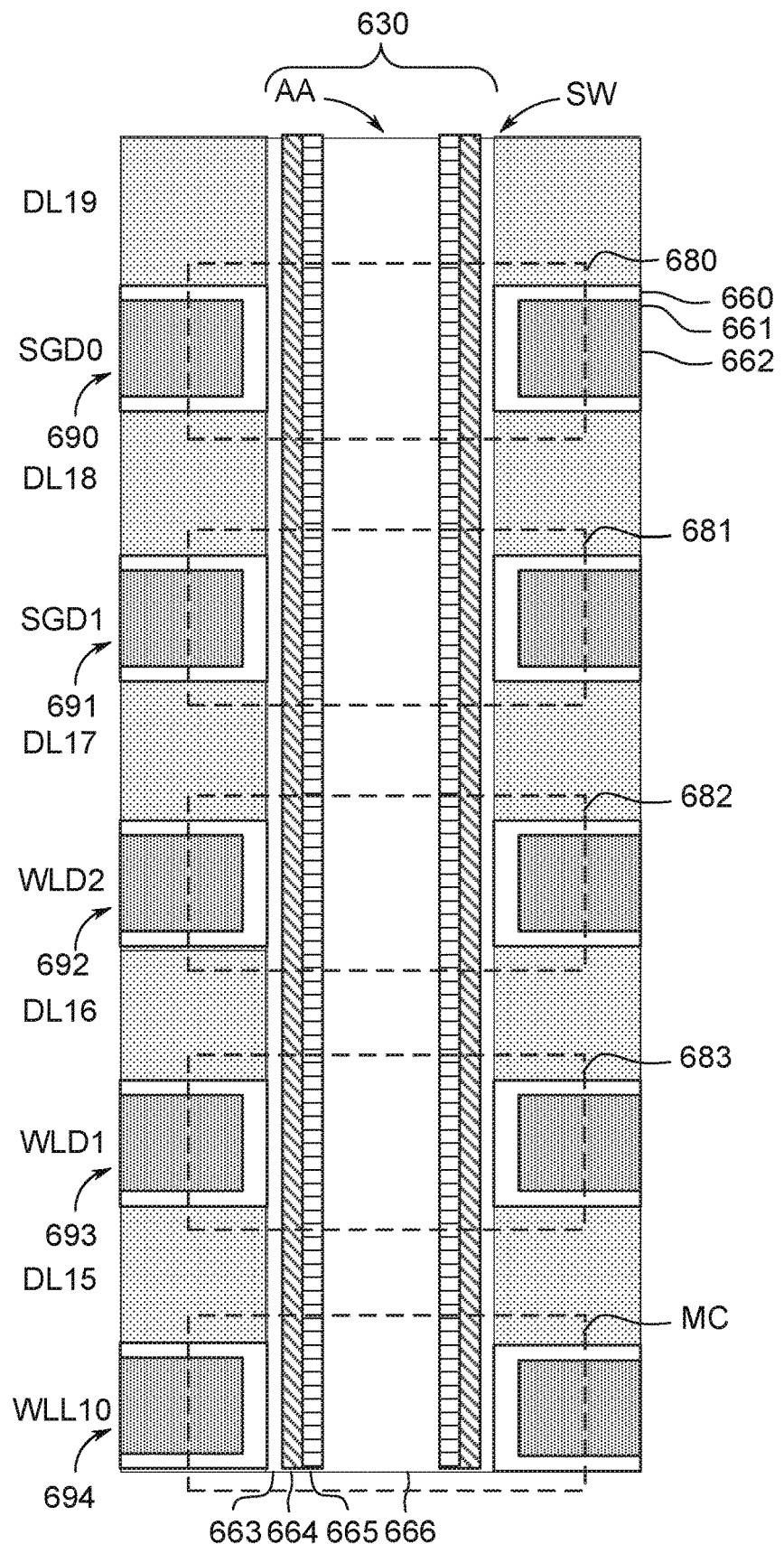
FIG. 5 depicts a close-up view of a region of the stack of FIG. 4.

FIG. 5 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer 663 or film such as SiN or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 6:
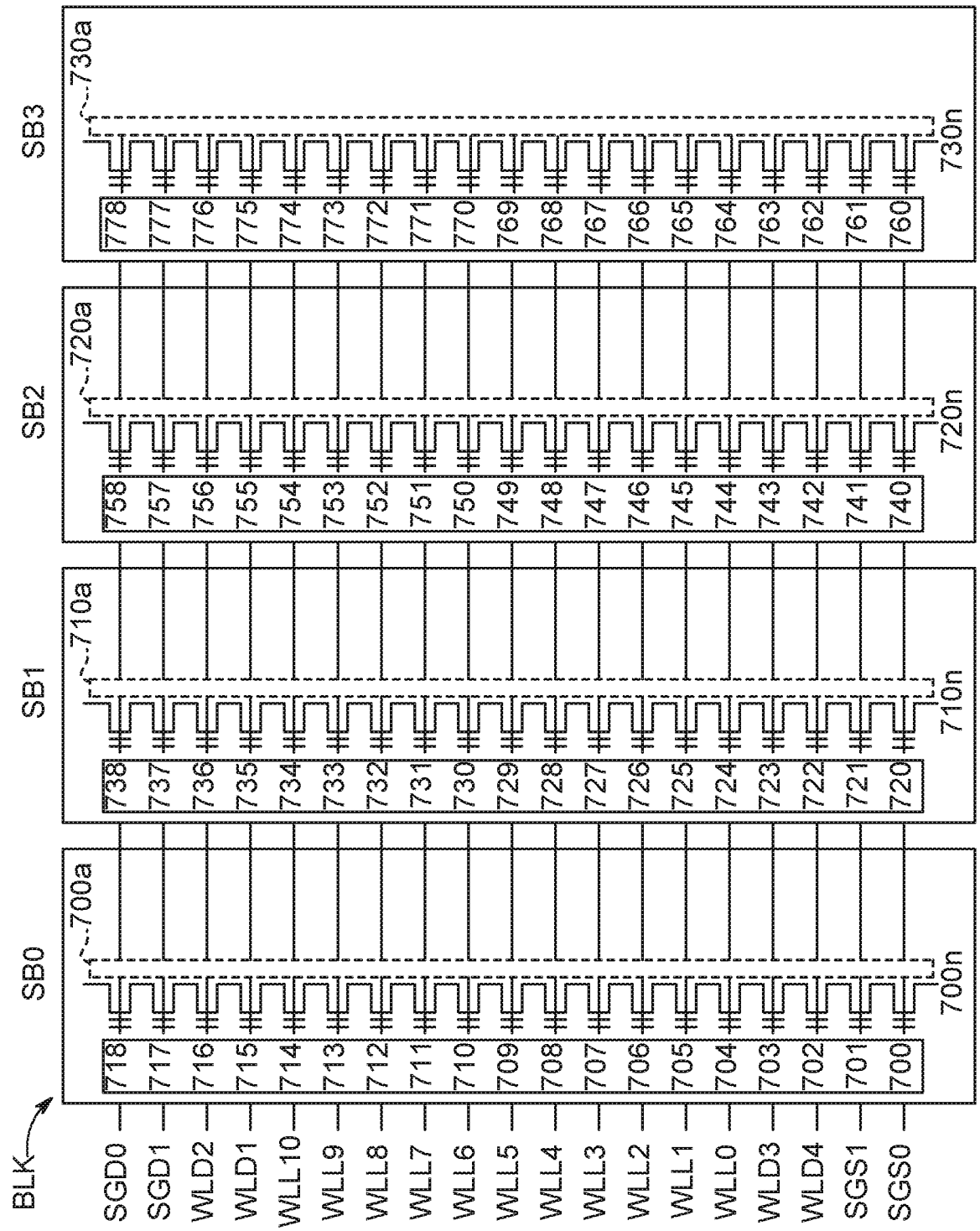
FIG. 6 depicts an example view of NAND strings in sub-blocks in a 3D configuration which is consistent with FIG. 4.

FIG. 6 depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line. As previously described, a sub-block may include multiple strings, while in other embodiments, a sub-block includes a single string.

The NAND strings 700n, 710n, 720n and 730n have channel regions 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

Figure 7:
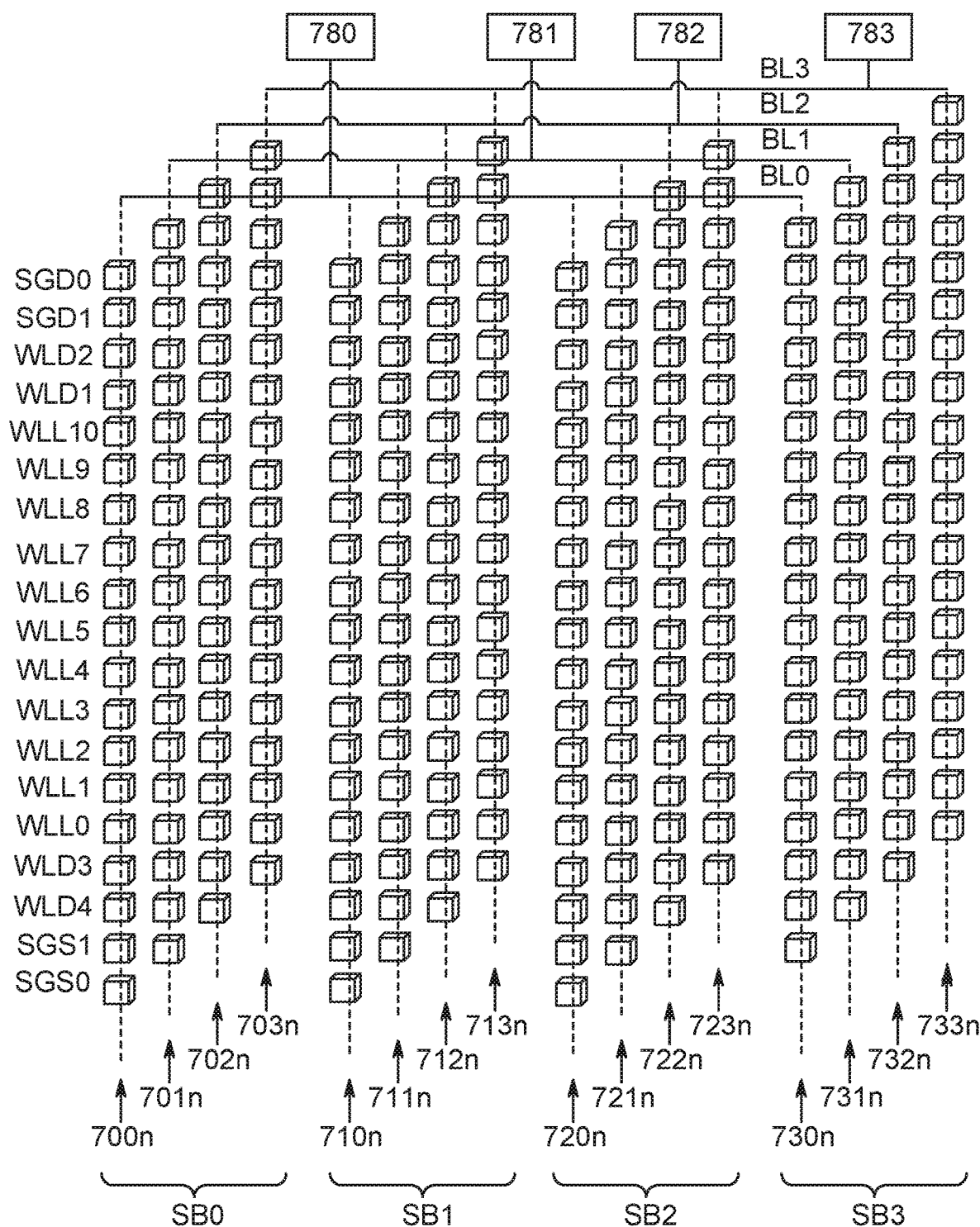
FIG. 7 depicts additional detail of the sub-blocks SB0-SB3 of FIG. 6.

FIG. 7 depicts additional detail of the sub-blocks SB0-SB3 of FIG. 6. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected toسets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3.

During a programming operation, the final Vth distribution can be achieved by using one or more programming loops. A multiple-pulse programmed storage device may be programmed through the use of multiple programming loops. Conversely, a single pulse programmed storage device may be programmed via a single programming loop, or a single programming pulse with no verify step. For multiple-pulse programming, each subsequent loop may use an increased programming pulse. During a programming loop, in certain embodiments, program-verify iterations are performed for a selected word line. A program-verify iteration comprises a program step/phase in which a program voltage is applied to the word line followed by a verify step/phase in which one or more verify tests are performed. Each programmed state may include a verify pulse which is used in the verify test for the state.

FIG. 8 depicts a waveform of an example conventional programming operation. Specifically, FIG. 8 depicts a multiple-pulse programming operation, in which stepped programming pulses are applied to program one or more storage cells. The horizontal axis depicts a program loop (PL) number and the vertical axis depicts memory cell control gate, a.k.a. word line voltage. Generally, a programming operation can involve applying a pulse sequence to a selected word line, where the pulse sequence includes multiple program loops or program-verify iterations. The program portion of the program-verify iteration comprises a program voltage, and the verify portion of the program-verify iteration comprises one or more verify pulses.

Each program loop includes two steps, in one approach. Further, Incremental Step Pulse Programming (ISPP) is used in this example, in which the program voltage steps up in each successive program loop using a fixed or varying step size.

The waveform 800 includes a series of program voltages 852, 854, and 856 that are applied to a word line selected for programming and to an associated set of non-volatile memory cells. One or more verify pulses can be provided after each program voltage as an example, based on the target data states which are verified. 0V may be applied to the selected word line between the program and verify pulses. For example, the concurrent programming component 150 may apply the first programming pulse 852, apply a verification pulse 860, apply the second programming pulse 854, apply the verification pulse 860 again, and then apply the third programming pulse 856. In another example embodiment, a trigger condition includes a storage cell programmed to a target voltage threshold. In this example embodiment, the concurrent programming component 150 may abort the pulse programming sequence, for example, after the first programming pulse 852 or after the second programming pulse 854, in response to determining that both the first storage cell and the second storage cell have reached the target threshold voltage. Additional examples of single pulse programming phases are set forth in U.S. Pat. No. 8,134,871, which is incorporated herein by reference.

In other example embodiments, programming a storage cell using a "single pulse" includes applying a single programming pulse, at an elevated voltage, to program the cell to the target threshold voltage instead of performing successive programming loops as depicted in FIG. 8. In one example, the programming circuit 284 applies a single programming pulse at Vpgm3 without applying Vpgm1 or Vpgm2. In another example, the programming circuit 284 applies 20 volts to the word line for the storage cell and a lower threshold voltage differential to the bit line for the storage cell. In this example, the voltage differential between the word line and the bit line is applied to the storage cell. In certain embodiments, an "elevated voltage" includes a voltage level that is higher than initial conventional programming loops in a conventional programming operation.

In one example, an "elevated voltage" is 18 volts. In another example embodiment, an "elevated voltage" is between 16 and 20 volts.

In other example embodiments, the concurrent program component 150 first applies a single pulse programming sequence and subsequently applies a multi-phase programming sequence in response to one of the first storage cell and the second storage cell not being correctly programmed. Specifically, in one such embodiment, the programming circuit 284 initially applies single-pulse programming to concurrently program the first and second storage cells to a common target threshold voltage, and then the verification circuit 286 simultaneously verifies the programming level of the first storage cell and the second storage cell. If the verification circuit 286 determines that one of the first and second storage cells is not properly programmed, then, in one embodiment, the programming circuit 284 may apply multi-pulse programming to separately program the first and second storage cells as one skilled in the art may appreciate. This programming step may be done for the first and second storage cells, at different times (for example, by programming the first storage cell and then the second storage cell). The verification circuit 286 then verifies proper programming of the first and second storage cells. This may be done concurrently for the first and second storage cells, or at different times (for example, by verifying proper programming of the first storage cell and then the second storage cell).

In another example embodiment, the first storage cell and the second storage cell are independently programmed in a series of conventional program-verify iterations in one programming operation. After completion of the programming pass, the concurrent programming component 150 independently verifies that each of the storage cells were correctly programmed.

Those of skill in the art will recognize that a wide variety of alternative cell programming methods may be used to separately program multiple storage cells. Single pulse programming, multiple pulse programming, and/or combinations thereof may be applied. Additional examples of single pulse programming are set forth in U.S. Pat. No. 9,343,141, which is incorporated herein by reference.

Figure 9:
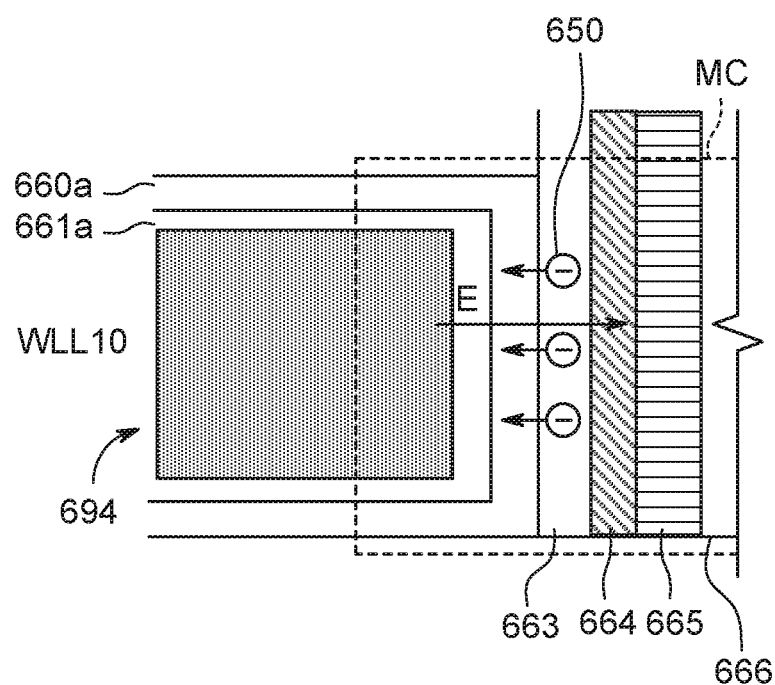
FIG. 9 depicts a portion of the memory cell MC of FIG. 5 showing electron injection into a charge trapping region during weak programming.

FIG. 9 depicts a portion of the memory cell MC of FIG. 5 showing electron injection into a charge trapping region during weak programming. The memory cell includes a control gate 694, a metal barrier 661*a*, a blocking oxide 660*a*, a charge-trapping layer 663, a tunneling layer 664, a channel 665 and a dielectric core 666. Due to the elevated word line voltage, an electric field (E) is created which attracts electrons (see example electron 650) into the charge trapping layer, increasing the Vth. This weak programming may be caused by the Fowler-Nordheim tunneling effect, in which an electrical insulator can conduct electricity. This is a kind of electron tunneling through traps.

Figure 10:
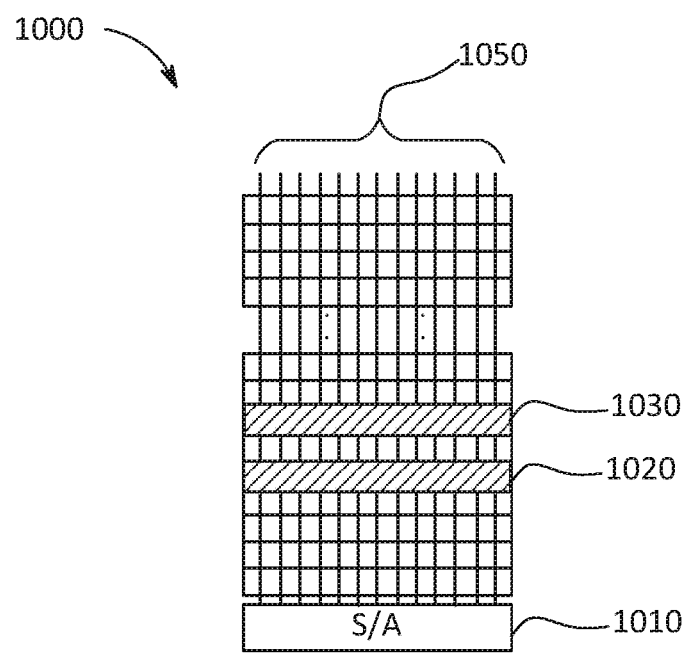
FIG. 10 depicts a top view of a series of blocks, according to one example embodiment.

FIG. 10 is a top view of an array of memory cells 1000 comprising a set of bit lines 1050 and an S/A data latch 1010. In this example embodiment, the bit lines 1050 are set according to data received at the S/A data latch 1010 and the data is to be written at certain storage cells corresponding to selected word lines as described herein.

In one example embodiment, bit lines 1050 are set according to data that is to be written to a storage cell in each string of storage cells corresponding to the selected bit lines and in the first erase block 1020. The concurrent programming component 150 selects another word line (not shown in FIG. 10) for a storage cell located in the second erase block 1030. As previously described, the concurrent programming component 150, in this example embodiment, electrically connects the word line for the first erase block 1020 and the word line for the second erase block 1030, whereby in response to the application of a programming pulse on one of the word lines, the storage cells in both blocks 1020, 1030 may be concurrently programmed to a common target threshold voltage. Thus, storage cells in each block 1020, 1030 are concurrently programmed according to the bit pattern set for the bit lines 1050.

In certain embodiments, the concurrent programming component 150 selects the first erase block 1020 and the second erase block 1030 to be at least one block apart from each other. In other words, there may be at least one block between the first erase block 1020 and the second erase block 1030. In other embodiments, the concurrent programming component 150 selects the two blocks that are at least a minimum physical distance from each other. For example, the minimum distance is 50 nanometers, but of course, this disclosure is not limited in this regard.

As previously described, by physically separating the first erase block 1020 from the second erase block 1030, a physical failure of the array of storage cells is less likely to affect both the first erase block 1020 and the second erase block 1030. In one example embodiment, the concurrent programming component 150 separates the array of storage cells into separate physical partitions or portions. In one example, the concurrent programming component 150 divides the array into four portions by dividing the array in half vertically and in half horizontally. Of course, other partitioning or physical portioning techniques may be used and this disclosure is not limited in this regard. Thus, as described herein, a "physical portion" includes a sub portion of an array of storage cells that is physically distinct from other storage cells in the array. In certain examples, the physical portion is determine using logical boundaries. Therefore, no physical differences may exist between various physical portions.

Figure 11:
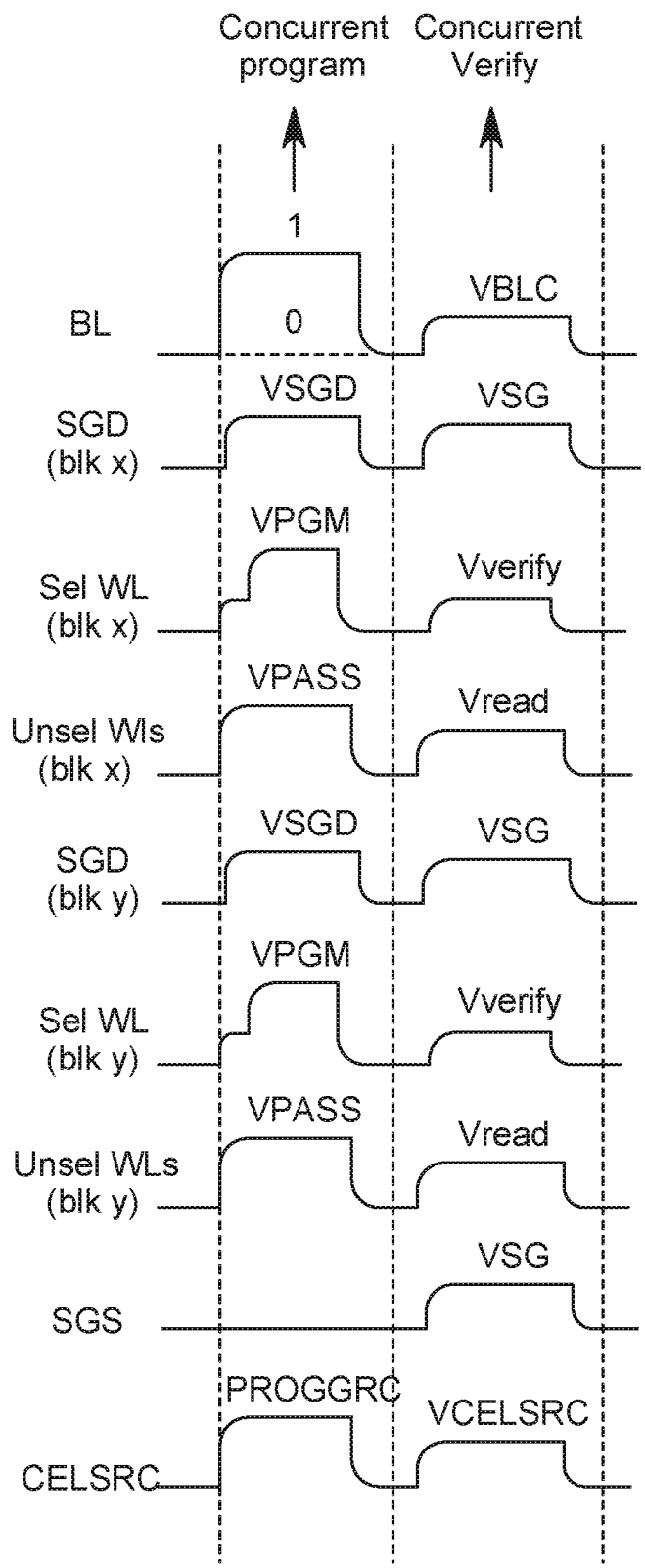
FIG. 11 is a chart of program and verify pulses, according to an example embodiment.

FIG. 11 is a chart of program and verify pulses, according to an example embodiment. In this example embodiment, in order to perform a concurrent program operation, the concurrent programming component 150 sets the voltage of unselected bit lines (data "1") to a high voltage (e.g., 2.5 volts) and sets the voltage of selected bit lines (data "0") to a low voltage (e.g., 0 volts), the drain select gate (SGD) in each block 1020, 1030 to VSGD (e.g., 2.5 volts), the selected word lines in the first erase block 1020 and the second erase block 1030 to a programming pulse (VPGM, e.g., 18 volts), unselected word lines in each block 1020, 1030 to a pass voltage (VPASS, e.g., 10 volts), the source select gate to 0 volts, and source line (CELSRC) voltage to PROGGRC (e.g., 2 volts).

In another example embodiment, in order to perform a concurrent verify operation, the concurrent programming component 150 sets the bit line to a bit line clamping voltage (VBLC), the SGD to a select gate voltage (VSG), each selected word line in each block to a verify pulse (Vverify), each unselected word line to a read voltage (Vread), the SGS to the select gate voltage VSG and the source line (CELSRC) voltage to VCELSRC (e.g., 1 volt).

Figure 12:
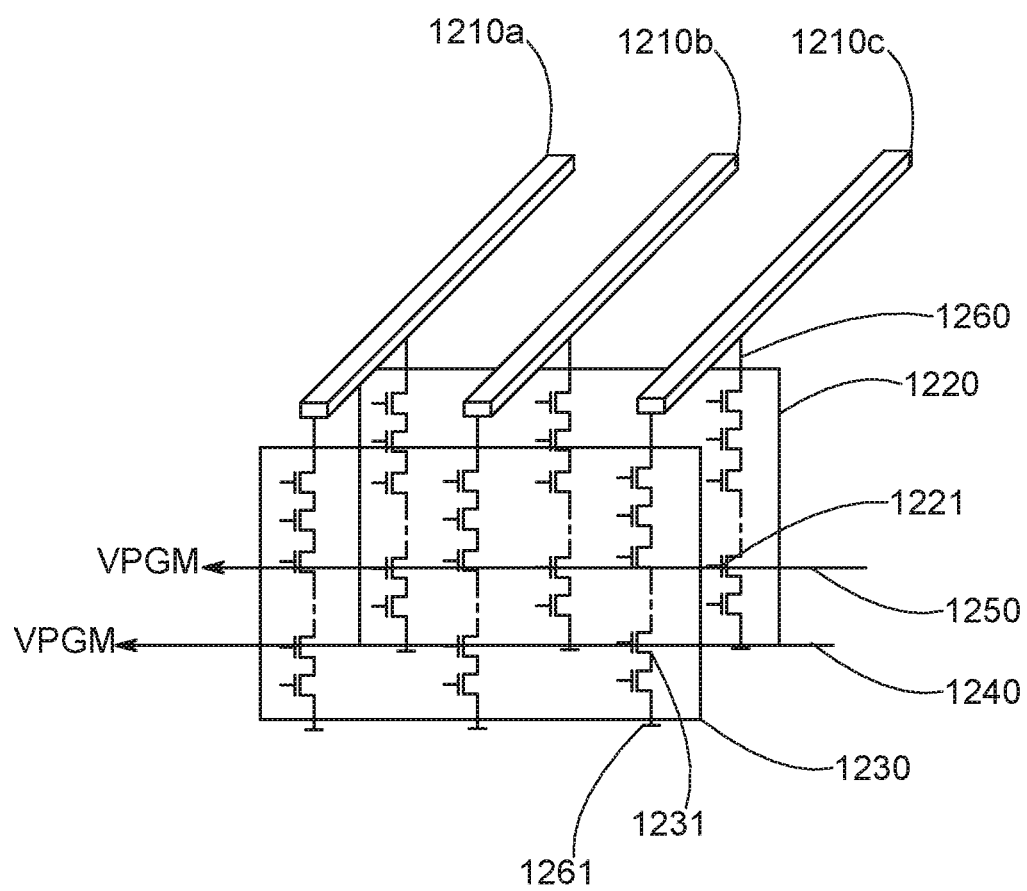
FIG. 12 depicts one embodiment of two blocks according to one example embodiment.

FIG. 12 depicts portions of two blocks according to one example embodiment. Bit lines 1210 are set according to data that will be written to storage cells in each of the blocks. In this example embodiment, the blocks include a first erase block 1220 and a second erase block 1230. Although three bit lines 1210 are depicted in FIG. 12, an array of storage cells may, of course, include many more bit lines. Further, although two blocks are depicted, one or more additional copies may optionally be made, for example, on a third block (not shown), a fourth block (not shown), and so on.

In one example embodiment, the concurrent programming component 150 electrically selects a bit line to program cells in a string that are connected to the bit line 1210. In this specific example, the concurrent programming component 150 selects the bit line 1210c. The concurrent programming component 150 also connects a first word line 1250 corresponding to a first storage cell 1221 with a second word line 1240 corresponding to a second storage cell 1231. For example, the concurrent programming component 150 may select a select gate transistor to electrically connect both the first word line 1250 and the second word line 1240 to a common connection. Specifically, the first erase block 1220 includes a first string 1260 that intersects with a first word line 1250 at a first storage cell 1221 and a second erase block 1230 includes a second string 1261 that intersects with a second word line 1240 at a second storage cell 1231. The concurrent programming component 150 applies a programming pulse to the connected word lines 1240, 1250 whereby the programming pulse is applied to the first storage cell 1221 and the second storage cell 1231.

In another example embodiment, the concurrent programming component 150, after concurrently applying the programming pulse to the first word line and second word line, applies a verify pulse to the first word line and second word line. Specifically, the concurrent programming component 150 applies the voltages described in the verify operation described with regard to FIG. 11. In this example embodiment, the concurrent programming component 150 then senses current flowing through one of the first storage cell 1221 and the second storage cell 1231 (e.g., by sensing current at a storage cell or an end of the NAND string) in response to application of the verify pulse to concurrently determine that one of the first storage cell 1221 and the second storage cell 1231 is not correctly programmed. In another example embodiment, the concurrent programming component 150 separately programs the first storage cell and the second storage cell in response to sensing current at through one of the first storage cell 1221 and the second storage cell 1231 as previously described. As described previously, the separate programming may be carried out in the same manner as the initial programming of the first storage cell 1221 and the second storage cell 1231, or the separate programming may be done differently, for example, by programming the first storage cell 1221 and the second storage cell 1231 separately and/or with a different programming pulse structure, such as conventional programming or via multiple pulse programming, or the like.

Figure 13:
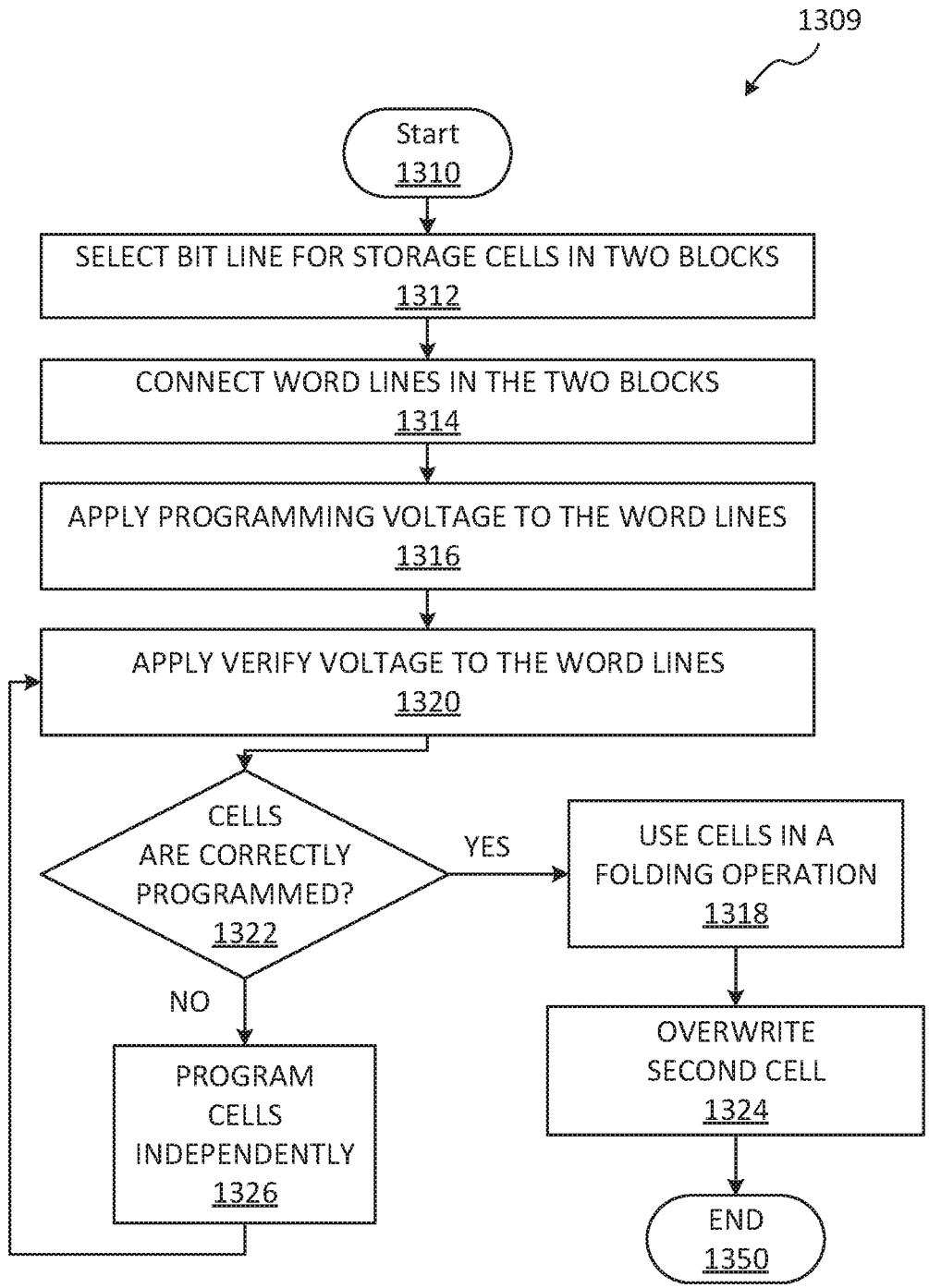
FIG. 13 depicts one embodiment of a method for concurrently programming cells of a memory array.

FIG. 13 depicts one embodiment of a method 1309 for concurrently programming cells of a memory array. The method 1309 may be performed each time one or more of the non-volatile memory elements 123 is to be programmed. The method 1309 may be performed by the die controller 220, for example, through the use of the various circuits set forth in FIG. 1B. In the alternative, the method 1309 may be performed with different hardware, such as the controller 244 of FIG. 1B and/or the non-volatile memory media controller 126 of FIG. 1A.

As shown, the method 1309 may start 1310 with a step 1312 in which a bit line is selected corresponding to storage cells (e.g., the non-volatile memory elements 123 of the memory array 200) that are to be programmed. In one example embodiment, the concurrent programming component 150 receives a command to program one or more of the non-volatile memory elements 123 of the memory array 200. The command may be received, for example, in the die controller 220. Such a command may be received in the programming circuit 284 of the die controller 220.

In a step 1314, word lines are selected for storage cells in two distinct blocks, or in alternative embodiments, in a common string within the same block. In one example embodiment, word lines in separate blocks are electrically connected as described previously.

In a step 1316, a programming pulse is applied to the connected word lines to concurrently program the storage cells in the two distinct blocks. This may be done by the programming circuit 284, which may apply the programming pulse concurrently across both of the selected word lines, thereby programming the first storage cell 1221 and the second storage cell 1231.

In a step 1320, a verify pulse is concurrently applied to the connected word lines. This may be done, for example, by the verification circuit 286.

In a step 1322, a current flowing through one of the first storage cell and the second storage cell is sensed to determine whether the first and second storage cells 1221, 1231 were correctly programmed. As previously described, if the memory array 200 is a NAND with conventional architecture, then current flow through the bit line in response to application of the verify pulse may indicate that the first storage cell and/or the second storage cell did not correctly program.

In one example embodiment, "sensing" current includes a charged capacitor which is then connected to a bit line with a voltage pulse applied to the word line. In response, if the storage cell does not have a threshold voltage at or below the level of the voltage on the word lines, current will flow from the bit line to a current drain. In this example embodiment, sensing current is a simple determination whether any current flowed in response to connecting the capacitor to the bit line.

In response to both the first storage cell and the second storage cell being correctly programmed, the method 1309 continues at a step 1318. In step 1318, data written to one of first storage cell 1221 and the second storage cell 1231 in the step 1316 is read and used to program a multi-level cell in an SLC-TLC compaction operation (folding operation). The SLC-TLC compaction operation may be carried out according to any method known in the art. In some embodiments, the data is retrieved from the first storage cell 1221 and/or the second storage cell 1231, and then combined with other data (such as a duplicate bit stored in a third storage cell and a fourth storage cell) to provide the value (for example, 0, 1, or 2) to be stored in the multi-level cell. The value is then written to the multi-level cell.

The method continues at a step 1324 and the concurrent programming component 150 overwrites the second storage cell. As used herein, "overwrite" includes the concurrent programming component 150 storing another data value in the storage cell in a subsequent programming operation. In other examples, at step 1324, the second storage cell is flagged for reuse, erased, or otherwise prepared for use to store other data. The method 1309 then ends 1350.

In response to one of the first storage cell and the second storage cell not being correctly programmed, the method 1309 continues at step 1326 and the programming circuit separately programs the first storage cell and the second storage cell. As mentioned previously, separate programming may be carried out for the first storage cell 1221 and the second storage cell 1231 with the same single-pulse methods used in the step 1316. Alternatively, the first storage cell 1221 and the second storage cell 1231 may be programmed separately and/or through the use of different methods, such as multiple-pulse programming.

After completing the separate programming procedure at step 1326, the method continues at step 1320 and a verify pulse is again applied to the storage cells. The verify pulse may optionally be applied as in the previous iteration of the step 1320, i.e., by concurrently applying the verify pulse concurrently to the word lines corresponding to the first storage cell 1221 and the second storage cell 1231. In the alternative, in place of the step 1320, a modified verify operation may be applied, in which proper programming of the first storage cell 1221 and the second storage cell 1231 is individually assessed, for example, by applying the verify pulse to just the word line for the first storage cell 1221, reading current through the bit line 1210c, and then applying the verify pulse to just the word line for the second storage cell 1231, reading current through the bit line 1210c again.

Figure 14:
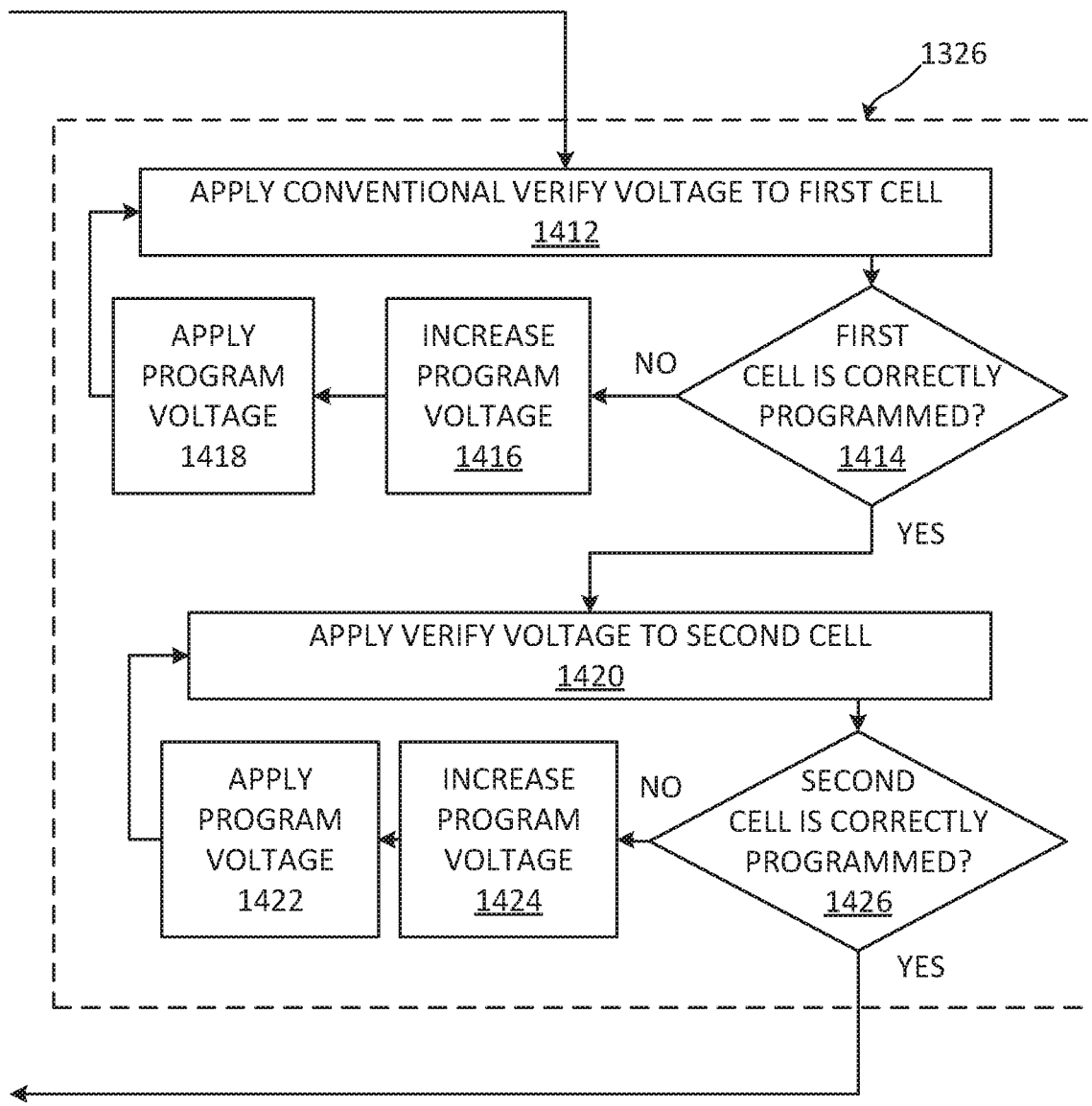
FIG. 14 depicts another embodiment of a method for concurrently programming cells of a memory array.

FIG. 14 depicts one embodiment of step 1326 for separately programming cells of a memory array. The step 1326 may be performed each time the first storage cell and/or the second storage cell fails to correctly program. In some embodiments, it may not be known whether it was the first storage cell 1221 or the second storage cell 1231 that did not program correctly; thus, the step 1326 may entail separately programming both the first storage cell 1221 and the second storage cell 1231. The step 1326 may be performed by the die controller 220, for example, through the use of the various circuits set forth in FIG. 1B. In the alternative, the step 1326 may be performed with different hardware, such as the controller 244 of FIG. 1B and/or the non-volatile memory media controller 126 of FIG. 1A.

As shown, the step 1326 may start with a step 1412 in which a conventional verify pulse is applied to the first storage cell 1221. It this example embodiment, it may not be known which of the two storage cells 1221, 1231 failed to correctly program. Thus, each of the two storage cells 1221, 1231 is independently programmed in this example embodiment. Thus, the first storage cell 1221 and the second storage cell 1231 are not electrically coupled for performance of the step 1412 and the step 1420 (described below). If desired, the second storage cell 1231 may be reprogrammed concurrently with reprogramming of the first storage cell 1221 by independently and concurrently applying programming voltages across the corresponding word lines for the first storage cell 1221 and the second storage cell 1231.

In a step 1414, a determination is made as to whether the first storage cell is correctly programmed. In one example, a current is sensed at a sensing component attached to either end of a NAND string that includes the first storage cell and in response to current flowing through the first storage cell, it is determined that the first storage cell did not successfully program.

In response sensing current at step 1414, the method continues at step 1416 and an increased programming pulse is applied as described herein. Any suitable increment in programming pulse may be used. In some embodiments, a lookup table of programming pulses or increments is used; each iteration of the step 1414 sets the programming pulse to the next programming pulse or increases the programming pulse by the next increment in the lookup table.

At a step 1418, as part of a conventional programming operation, an increased programming pulse is applied to the first storage cell and the step 1326 continues at step 1412 as previously described. In this example embodiment of the method, steps 1414, 1416, 1418, and 1412 may be repeated many times. In response to the first storage cell being correctly programmed, the method 1309 continues at a step 1420. Notably, if the first storage cell 1221 meets certain criteria, such as exceeding a threshold programming pulse in order to obtain proper programming, the first storage cell 1221 may be flagged for reduced use or for non-use in the future. If desired, first storage cell 1221 may still be used in the current storage operation. In the alternative, the first storage cell 1221 may not be used, and the data to be written to the first storage cell 1221 may instead be written to a different storage cell (potentially on a third block different from the first erase block 1220 and the second erase block 1230).

At step 1420, a verify pulse is applied to the second storage cell 1231. In a step 1426, it is determined whether the second storage cell 1231 is correctly programmed. In one example, a current is sensed at one of the first storage cell and the second storage cell and in response to current flowing through the bit line, it is determined that the second storage cell did not successfully program. As described in connection with the step 1412, the first storage cell 1221 and the second storage cell 1231 may optionally be electrically decoupled for performance of the step 1420 so that the programming of the second storage cell 1231, alone, can be verified.

In response sensing current at step 1426, the method 1309 continues at step 1424 and a programming pulse is increased as described herein. Any suitable method may be used to calculate the new programming pulse. As in the step 1416, a lookup table or the like may be used.

At a step 1422, an increased programming pulse is applied to the second storage cell 1231 and the step 1326 continues at step 1420 as previously described. Like the steps 1412, 1414, 1416, and 1418, the steps 1426, 1424, 1422, and 1420 may be repeated many times. In response to the second storage cell being correctly programmed, the method 1309 continues at a step 1320.

A means for electrically connecting a first word line and a second word line, in various embodiments, may include a concurrent programming component 150, a die controller 220, a programming circuit 284, a non-volatile memory device interface 139, a non-volatile memory media controller 126, a device driver, a controller (e.g., a device driver, or the like) executing on a host computing device 110, a processor 111, or other logic hardware.

A means for electrically selecting a bit line, in various embodiments, may include a concurrent programming component 150, a die controller 220, a programming circuit 284, a non-volatile memory device interface 139, a non-volatile memory media controller 126, a host computing device 110, a bus 127, a communications network 115, a device driver, a controller (e.g., a device driver, or the like) executing on a host computing device 110, a processor 111, other logic hardware, and/or other executable code stored on a computer readable storage medium.

A means for applying a single programming pulse to the connected word lines, in various embodiments, may include a concurrent programming component 150, a die controller 220, a programming circuit 284, a non-volatile memory device interface 139, a non-volatile memory media controller 126, a storage client 116, a host computing device 110, a bus 127, a communications network 115, a device driver, a controller (e.g., a device driver, or the like) executing on a host computing device 110, a processor 111, other logic hardware, and/or other executable code stored on a computer readable storage medium.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
    a set of non-volatile storage cells arranged into:
        a first erase block comprising a first string of storage cells that intersects a first word line at a first storage cell; and
        a second erase block comprising a second string of storage cells that intersects a second word line at a second storage cell;
    a bit line electrically connectable to the first string and the second string; and
    a controller configured to concurrently apply a programming pulse to the first and second word lines to concurrently program the first and second storage cells to a common target threshold voltage;
    wherein the controller is further configured to determine whether the first storage cell is correctly programmed, and to overwrite the second storage cell in response to determining that the first storage cell is correctly programmed.

2. The apparatus of claim 1, wherein the controller is further configured to:
    after concurrently applying the programming pulse to the first word line and the second word line, apply a verify pulse to the first word line and second word line; and
    sense to detect whether current flows at one of the first storage cell or the second storage cell to determine that one of the first storage cell and the second storage cell is not correctly programmed.

3. The apparatus of claim 1, wherein in response to determining that one of the first storage cell and the second storage cell is not correctly programmed, the controller is further configured to program the first storage cell in a first conventional programming operation and program the second storage cell in a second conventional programming operation.

4. The apparatus of claim 1, wherein the programming pulse exceeds 18 volts.

5. The apparatus of claim 1, wherein the controller concurrently applies the programming pulse to a set of two or more word lines in respective blocks to concurrently program an additional storage cell in each of the respective blocks.

6. The apparatus of claim 1, wherein the controller is further configured to:
    read data from one of the first storage cell and the second storage cell; and
    use the data to program a multi-level cell in a cell compaction operation.

7. The apparatus of claim 1, wherein the second erase block is in a separate physical portion of the set of non-volatile storage cells from the first erase block.

8. An apparatus comprising:
    a set of non-volatile storage cells arranged into:
        a first erase block comprising a first string of storage cells that intersects a first word line at a first storage cell; and
        a second erase block comprising a second string of storage cells that intersects a second word line at a second storage cell;
    a bit line electrically connectable to the first string and the second string; and
    a controller configured to
        concurrently apply a programming pulse to the first and second word lines to concurrently program the first and second storage cells to a common target threshold voltage;
        determine that the first storage cell is correctly programmed;
        in response to determining that the first storage cell is correctly programmed, read data from the first storage cell; and
        after reading the data from the first storage cell, overwrite the first storage cell and the second storage cell.

9. An apparatus comprising:
    a set of non-volatile storage cells arranged into a first erase block and a second erase block, each erase block electrically connected to a set of bit lines, the first erase block comprising a first word line and the second erase block comprising a second word line; and
    one or more circuits configured to
        electrically select a first set of storage cells in the first erase block and a second set of storage cells in the second erase block;
        apply a programming pulse in a single pulse to the first word line and the second word line to concurrently write the same data values to the first set of storage cells and to the second set of storage cells;
        determine that the first set of storage cells and the second set of storage cells are correctly programmed; and
        in response to determining that the first set of storage cells and the second set of storage cells are correctly programmed, overwrite the second set of storage cells.

10. The apparatus of claim 9, wherein the one or more circuits is further configured to:
    apply a verify pulse to the first word line and the second word line; and
    sense current flowing through respective bit lines in the set of bit lines in response to application of the verify pulse to determine that one of the first set of storage cells and the second set of storage cells is not correctly programmed.

11. The apparatus of claim 10, wherein in response to determining that one of the first set of storage cells and the second set of storage cells is not correctly programmed, the one or more circuits is configured to program the first set of storage cells and the second set of storage cells in separate conventional programming operations.

12. The apparatus of claim 9, wherein:
    the non-volatile storage cells of the first erase block are configured to be erased together in a single, first operation, and
    the non-volatile storage cells of the second erase block are configured to be erased together in a single, second operation separate and distinct from the first operation.

13. The apparatus of claim 9, wherein the second erase block is physically separated from the first erase block.

14. A method comprising:
    electrically selecting a bit line for an array of non-volatile storage cells arranged into two blocks, the bit line connectable to storage cells in each of the two blocks;
    electrically connecting separate word lines including a first word line corresponding to one of the storage cells in a first of the two blocks, and a second word line corresponding to one of the storage cells in a second of the two blocks; and concurrently applying a programming pulse to the connected word lines to concurrently program the one of the storage cells in the first of the two blocks and the one of the storage cells in the second of the two blocks;

after concurrently applying the programming pulse to the connected word lines, concurrently applying a verify pulse to the connected word lines; and sensing current flowing through one of the storage cells in response to application of the verify pulse to determine that one of the storage cells is not correctly programmed.

15. The method of claim 14, further comprising, in response to determining that one of the storage cells is not correctly programmed, programming the storage cells in independent conventional operations.

16. The method of claim 14, further comprising:

reading data from one of a first storage cell of the storage cells within a first erase block of the two blocks, and a second storage cell of the storage cells within a second erase block of the two blocks; and using the data to program a multi-level cell in a cell compaction operation.

17. The method of claim 14, wherein a first of the two blocks is physically separated from a second of the two blocks.

18. The method of claim 14, further comprising:

determining that the one of the storage cells in the first of the two blocks or the one of the storage cells in the second of the two blocks is not correctly programmed; and in response to determining that the one of the storage cells in the first of the two blocks or the one of the storage cells in the second of the two blocks is not correctly programmed, programming the one of the storage cells in the first of the two blocks in a first programming operation and programming the one of the storage cells in the second of the two blocks in a second programming operation.

19. The method claim 14, further comprising:

determining that the one of the storage cells in the first of the two blocks is correctly programmed;

in response to determining that the one of the storage cells in the first of the two blocks is correctly programmed, reading data from the one of the storage cells in the first of the two blocks; and after reading the data from the one of the storage cells in the first of the two blocks, overwriting the one of the storage cells in the first of the two blocks and the one of the storage cells in the second of the two blocks.

20. The method of claim 14, further comprising:

determining that the one of the storage cells in the first of the two blocks is correctly programmed, and in response thereto, reading data from the one of the storage cells in the first of the two blocks, and preparing the one of the storage cells in the second of the two blocks for use to store other data.

21. A method comprising:

electrically selecting a bit line for an array of non-volatile storage cells arranged into two blocks, the bit line connectable to storage cells in each of the two blocks;

electrically connecting separate word lines including a first word line corresponding to one of the storage cells in a first of the two blocks, and a second word line corresponding to one of the storage cells in a second of the two blocks;

concurrently applying a programming pulse to the connected word lines to concurrently program the one of the storage cells in the first of the two blocks and the one of the storage cells in the second of the two blocks;

determining that the one of the storage cells in the first of the two blocks is correctly programmed;

in response to determining that the one of the storage cells in the first of the two blocks is correctly programmed, reading the one of the storage cells in the first of the two blocks; and after reading the one of the storage cells in the first of the two blocks, overwriting the one of the storage cells in the first of the two blocks and the one of the storage cells in the second of the two blocks.

\* \* \* \* \*